(12) United States Patent
Bittner et al.

(10) Patent No.: US 11,799,049 B2
(45) Date of Patent: Oct. 24, 2023

(54) METAMORPHIC SOLAR CELLS

(71) Applicant: SolAero Technologies Corp., Albuquerque, NM (US)

(72) Inventors: Zachary Bittner, Albuquerque, NM (US); John Hart, Albuquerque, NM (US); Samantha Whipple, Albuquerque, NM (US); Nathaniel Miller, Albuquerque, NM (US); Daniel Derkacs, Albuquerque, NM (US)

(73) Assignee: SolAero Technologies Corp., Albuquerque, NM (US)

(*) Notice: Subject to any disclaimer, the term of this patent is extended or adjusted under 35 U.S.C. 154(b) by 57 days.

(21) Appl. No.: 17/241,336

(22) Filed: Apr. 27, 2021

(65) Prior Publication Data
US 2021/0408320 A1    Dec. 30, 2021

Related U.S. Application Data

(62) Division of application No. 16/736,662, filed on Jan. 7, 2020, now Pat. No. 11,380,813.

(51) Int. Cl.
*H01L 31/18*     (2006.01)
*H01L 31/0735*   (2012.01)

(52) U.S. Cl.
CPC ...... *H01L 31/1844* (2013.01); *H01L 31/0735* (2013.01); *H01L 31/1852* (2013.01)

(58) Field of Classification Search
CPC .......... H01L 31/0687; H01L 31/06875; H01L 31/0725; H01L 31/0735; H01L 31/1844; H01L 31/1852
See application file for complete search history.

(56) References Cited

U.S. PATENT DOCUMENTS

| | | | |
|---|---|---|---|
| 2012/0240987 A1* | 9/2012 | King | H01L 31/06875 438/57 |
| 2015/0104898 A1* | 4/2015 | Derkacs | H01L 31/0687 438/73 |
| 2016/0133775 A1* | 5/2016 | Fuhrmann | H01L 31/0687 136/246 |
| 2017/0345955 A1* | 11/2017 | Chary | H01L 31/188 |

OTHER PUBLICATIONS

Schone "Kontrolle von Spannungsrelaxation und Defektbildung in metamorphen III-V Halbleiterheterostrukturen für hocheffiziente Solarzellen", PhD Diss., Christian-Albrechts Universitat Kiel, 2009. (Year: 2009).*
Schone, Control of stress relaxation and defect formation in metamorphic III-V semiconductor hetero-structures for high efficiency solar cells, PhD Diss., Christian-Albrechts Universitat Kiel, 2009, English Machine translation (Year: 2009).*

* cited by examiner

*Primary Examiner* — Andrew J Golden

(57) ABSTRACT

A multijunction solar cell including a metamorphic layer, and particularly the design and specification of the composition, lattice constant, and band gaps of various layers above the metamorphic layer in order to achieve reduction in "bowing" of the semiconductor wafer caused by the lattice mismatch of layers associated with the metamorphic layer.

22 Claims, 16 Drawing Sheets

METAMORPHIC SOLAR CELLS

REFERENCE TO RELATED APPLICATIONS

This application is a divisional of U.S. patent application Ser. No. 16/736,662 filed Jan. 7, 2020, which claims the benefit of U.S. Provisional Patent Application Ser. No. 62/803,962 filed Feb. 11, 2019.

BACKGROUND OF THE INVENTION

Field of the Invention

The present disclosure relates to solar cells and the fabrication of solar cells, and more particularly the design and specification of the composition, lattice constant, and band gaps of various layers above and below a metamorphic layer in a multijunction solar cell based on III-V semiconductor compounds in order to achieve reduction in "bowing" of the wafer caused by the metamorphic layer.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology. Compared to silicon, III-V compound semiconductor multijunction devices have greater energy conversion efficiencies and are generally more radiation resistance, although they tend to be more complex to properly specify and manufacture. Typical commercial III-V compound semiconductor multijunction solar cells have energy efficiencies that exceed 29.5% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of series connected photovoltaic regions with different band gap energies, and accumulating the voltage at a given current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads use increasing amounts of power as they become more sophisticated, and missions and applications anticipated for five, ten, twenty or more years, the power-to-weight (W/kg) and power-to-area (W/m$^2$) ratios of the solar cell array and the lifetime efficiency of a solar cell becomes increasingly more important. There is increasing interest not only the amount of power provided per gram of weight and spatial area of the solar cell, not only at initial deployment but over the entire service life of the satellite system, or in terms of a design specification, the amount of residual power provided at the specified "end of life" (EOL), which is affected by the radiation exposure of the solar cell over time in the particular space environment of the solar cell array, the period of the EOL being different for different missions and applications.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload, the amount of electrical storage capacity (batteries) on the spacecraft, and the power demands of the payloads during different orbital configurations.

A solar cell designed for use in a space vehicle (such as a satellite, space station, or an interplanetary mission vehicle), has a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

There are substantially more rigorous qualification and acceptance testing protocols used in the manufacture of space solar cells compared to terrestrial cells, to ensure that space solar cells can operate satisfactorily at the wide range of temperatures and temperature cycles encountered in space. These testing protocols include (i) high-temperature thermal vacuum bake-out; (ii) thermal cycling in vacuum (TVAC) or ambient pressure nitrogen atmosphere (APTC); and in some applications (iii) exposure to radiation equivalent to that which would be experienced in the space mission, and measuring the current and voltage produced by the cell and deriving cell performance data.

As used in this disclosure and claims, the term "space-qualified" shall mean that the electronic component (i.e., in this disclosure, the solar cell) provides satisfactory operation under the high temperature and thermal cycling test protocols. The exemplary conditions for vacuum bake-out testing include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10.1109/PVSC 2013 6745052). Such rigorous testing and qualifications are not generally applicable to terrestrial solar cells and solar cell arrays.

Conventionally, such measurements are made for the AM0 spectrum for "one-sun" illumination, but for PV systems which use optical concentration elements, such measurements may be made under concentrations such as 2×, 100×, or 1000× or more.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units). The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

A further distinctive difference between space solar cell arrays and terrestrial solar cell arrays is that a space solar cell array utilizes welding and not soldering to provide robust electrical interconnections between the solar cells, while terrestrial solar cell arrays typically utilize solder for electrical interconnections. Welding is required in space solar cell arrays to provide the very robust electrical connections that can withstand the wide temperature ranges and temperature cycles encountered in space such as from −175° C. to +180° C. In contrast, solder joints are typically sufficient to survive the rather narrow temperature ranges (e.g., about −40° C. to about +50° C.) encountered with terrestrial solar cell arrays.

A further distinctive difference between space solar cell arrays and terrestrial solar cell arrays is that a space solar cell array utilizes silver-plated metal material for interconnection members, while terrestrial solar cells typically utilize copper wire for interconnects. In some embodiments, the interconnection member can be, for example, a metal plate. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

An additional distinctive difference between space solar cell arrays and terrestrial solar cell arrays is that space solar cell arrays typically utilize an aluminum honeycomb panel for a substrate or mounting platform. In some embodiments, the aluminum honeycomb panel may include a carbon composite face sheet adjoining the solar cell array. In some embodiments, the face sheet may have a coefficient of thermal expansion (CTE) that substantially matches the CTE of the bottom germanium (Ge) layer of the solar cell that is attached to the face sheet. Substantially matching the CTE of the face sheet with the CTE of the Ge layer of the solar cell can enable the array to withstand the wide temperature ranges encountered in space without the solar cells cracking, delaminating, or experiencing other defects. Such precautions are generally unnecessary in terrestrial applications.

Thus, a further distinctive difference of a space solar cell from a terrestrial solar cell is that the space solar cell must include a cover glass over the semiconductor device to provide radiation resistant shielding from particles in the space environment which could damage the semiconductor material. The cover glass is typically a ceria doped borosilicate glass which is typically from three to six mils in thickness and attached by a transparent adhesive to the solar cell.

In summary, it is evident that the differences in design, materials, and configurations between a space-qualified III-V compound semiconductor solar cell and subassemblies and arrays of such solar cells, on the one hand, and silicon solar cells or other photovoltaic devices used in terrestrial applications, on the other hand, are so substantial that prior teachings associated with silicon or other terrestrial photovoltaic system are simply unsuitable and have no applicability to the design configuration of space-qualified solar cells and arrays. Indeed, the design and configuration of components adapted for terrestrial use with its modest temperature ranges and cycle times often teach away from the highly demanding design requirements for space-qualified solar cells and arrays and their associated components.

The assembly of individual solar cells together with electrical interconnects and the cover glass form a so-called "CIC" (Cell-Interconnected-Cover glass) assembly, which are then typically electrically connected to form an array of series-connected solar cells. The solar cells used in many arrays often have a substantial size; for example, in the case of the single standard substantially "square" solar cell trimmed from a 100 mm wafer with cropped corners, the solar cell can have a side length of seven cm or more.

The radiation hardness of a solar cell is defined as how well the cell performs after exposure to the electron or proton particle radiation which is a characteristic of the space environment. A standard metric is the ratio of the end of life performance (or efficiency) divided by the beginning of life performance (EOL/BOL) of the solar cell. The EOL performance is the cell performance parameter after exposure of that test solar cell to a given fluence of electrons or protons (which may be different for different space missions or orbits). The BOL performance is the performance parameter prior to exposure to the particle radiation.

Charged particles in space could lead to damage to solar cell structures, and in some cases, dangerously high voltage being established across individual devices or conductors in the solar array. These large voltages can lead to catastrophic electrostatic discharging (ESD) events. Traditionally for ESD protection the backside of a solar array may be painted with a conductive coating layer to ground the array to the space plasma, or one may use a honeycomb patterned metal panel which mounts the solar cells and incidentally protects the solar cells from backside radiation. Furthermore, the front side of the solar array may provide a conductive coating or adhesive to the periphery of the cover glass to ground the top surface of the cover glass.

The radiation hardness of the semiconductor material of the solar cell itself is primarily dependent on a solar cell's minority carrier diffusion length ($L_{min}$) in the base region of the solar cell (the term "base" region referring to the p-type base semiconductor region disposed directly adjacent to an n-type "emitter" semiconductor region, the boundary of which establishes the p-n photovoltaic junction). The less degraded the parameter $L_{min}$ is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a gradation in dopant elements in the semiconductor base layer of the subcells so as to create an electric field to direct minority carriers to the junction of the subcell, thereby effectively increasing $L_{min}$. The effectively longer $L_{min}$ will improve the cell performance, even after the particle radiation exposure.

Making the cell less sensitive to $L_{min}$ reductions has involved increasing the optical absorption of the base layer such that thinner layers of the base can be used to absorb the same amount of incoming optical radiation.

Another consideration in connection with the manufacture of space solar cell arrays is that conventionally, solar cells have been arranged on a support and interconnected using a substantial amount of manual labor. For example, first individual CICs are produced with each interconnect individually welded to the solar cell, and each cover glass individually mounted. Then, these CICs are connected in series to form strings, generally in a substantially manual manner, including the welding steps from CIC to CIC. Then, these strings are applied to a panel substrate and electrically interconnected in a process that includes the application of adhesive, wiring, etc. All of this has traditionally been carried out in a manual and substantially artisanal manner.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance.

Moreover, the current (or more precisely, the short circuit current density $J_{sc}$) and the voltage (or more precisely, the open circuit voltage $V_{oc}$) are not the only factors that determine the power output of a solar cell. In addition to the power being a function of the short circuit density ($J_{sc}$) and the open circuit voltage ($V_{oc}$), the output power is actually computed as the product of $V_{oc}$ and $J_{sc}$, and a Fill Factor (FF). As might be anticipated, the Fill Factor parameter is not a constant, but in fact may vary at a value between 0.5 and somewhat over 0.85 for different arrangements of elemental compositions, subcell thickness, and the dopant level and profile. Although the various electrical contributions to the Fill Factor such as series resistance, shunt resistance, and ideality (a measure of how closely the semiconductor diode follows the ideal diode equation) may be theoretically understood, from a practical perspective the actual Fill Factor of a given subcell cannot always be predicted, and the effect of making an incremental change in composition or band gap of a layer may have unanticipated consequences and effects on the solar subcell semiconductor material, and therefore an unrecognized or unappreciated effect on the Fill Factor. Stated another way, an attempt to maximize power by varying a composition of a subcell layer to increase the $V_{oc}$ or $J_{sc}$ or both of that subcell, may in fact not result in high power, since although the product $V_{oc}$ and $J_{sc}$ may increase, the FF may decrease and the resulting power also decrease. Thus, the $V_{oc}$ and $J_{sc}$ parameters, either alone or in combination, are not necessarily "result effective" variables that those skilled in the art confronted with complex design specifications and practical operational considerations can easily adjust to optimize performance.

[24] Furthermore, the fact that the short circuit current density ($J_{sc}$) the open circuit voltage ($V_{oc}$), and the fill factor (FF), are affected by the slightest change in such design variables, the purity or quality of the chemical pre-cursors, or the specific process flow and fabrication equipment used, and such considerations further complicates the proper specification of design parameters and predicting the efficiency of a proposed design which may appear "on paper" to be advantageous.

It must be further emphasized that in addition to process and equipment variability, the "fine tuning" of minute changes in the composition, band gaps, thickness, and doping of every layer in the arrangement has critical effect on electrical properties such as the open circuit voltage ($V_{oc}$) and ultimately on the power output and efficiency of the solar cell.

To illustrate the practical effect, consider a design change that results in a small change in the $V_{oc}$ of an active layer in the amount of 0.01 volts, for example changing the $V_{oc}$ from 2.72 to 2.73 volts. Assuming all else is equal and does not change, such a relatively small incremental increase in voltage would typically result in an increase of solar cell efficiency from 29.73% to 29.84% for a triple junction solar cell, which would be regarded as a substantial and significant improvement that would justify implementation of such design change.

For a single junction GaAs subcell in a triple junction device, a change in $V_{oc}$ from 1.00 to 1.01 volts (everything else being the same) would increase the efficiency of that junction from 10.29% to 10.39%, about a 1% relative increase. If it were a single junction stand-alone solar cell, the efficiency would go from 20.58% to 20.78%, still about a 1% relative improvement in efficiency.

Present day commercial production processes are able to define and establish band gap values of epitaxially deposited layers as precisely as 0.01 eV, so such "fine tuning" of compositions and consequential open circuit voltage results are well within the range of operational production specifications for commercial products.

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar or substantially similar crystal lattice constants or parameters.

Here again there are trade-offs between including specific elements in the composition of a layer which may result in improved voltage associated with such subcell and therefore potentially a greater power output, and deviation from exact crystal lattice matching with adjoining layers as a consequence of including such elements in the layer which may result in a higher probability of defects, and therefore lower manufacturing yield.

In that connection, it should be noted that there is no strict definition of what is understood to mean two adjacent layers are "lattice matched" or "lattice mismatched". For purposes in this disclosure, "lattice mismatched" refers to two adjacently disposed materials or layers (with thicknesses of greater than 100 nm) having in-plane lattice constants of the materials in their fully relaxed state differing from one another by less than 0.02% in lattice constant. (Applicant notes that this definition is considerably more stringent than that proposed, for example, in U.S. Pat. No. 8,962,993, which suggests less than 0.6% lattice constant difference as defining "lattice mismatched" layers).

The conventional wisdom for many years has been that in a monolithic tandem solar cell, " . . . the desired optical transparency and current conductivity between the top and bottom cells . . . would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open circuit voltage ($V_{oc}$), short circuit current ($J_{sc}$) and fill factor (FF), which represents the relationship or balance between current and voltage for effective output" (Jerry M. Olson, U.S. Pat. No. 4,667,059, "Current and Lattice Matched Tandem Solar Cell").

As progress has been made toward higher efficiency multijunction solar cells with four or more subcells, nevertheless, "it is conventionally assumed that substantially lattice-matched designs are desirable because they have proven reliability and because they use less semiconductor material than metamorphic solar cells, which require relatively thick buffer layers to accommodate differences in the lattice constants of the various materials" (Rebecca Elizabeth Jones-Albertus et al., U.S. Pat. No. 8,962,993).

The present disclosure proposes design features for multijunction solar cells which departs from such conventional wisdom for increasing the efficiency of the multijunction solar cell in converting solar energy (or photons) to electrical energy and optimizing such efficiency at the "end-of-life" period.

One consequence of a lattice mismatched design and the use of a metamorphic buffer layer between two subcells has been noted in U.S. Patent Application Publication 20160380142, which provides a background discussion concerning the inherent residual stress associated with the use of a metamorphic buffer layer disposed between two subcells in a multijunction solar cell, configured or grown either in an upright arrangement or in an inverted arrangement (in which the highest band gap subcells are grown first).

Depending on the thickness and resulting flexibility of the substrate employed, the residual stress leads results in an undesirable curvature or "bowing" of the wafer after fabrication of the epitaxial layers. In particular, such bowing arises in fabrication of metamorphic solar cells on conventional Ge substrates with a thickness smaller than 190 microns.

As noted in the cited reference, such bowing results in nonhomogeneous layer properties during and after the epitaxy process. Consequentially, the processing of such wafers is made more difficult than if the wafers were perfectly flat, which reduces the production yield and thereby increases production costs.

The two different types of stress imparted by a metamorphic buffer layer are tensile stress and compressive stress. Tensile stress results in a convex curvature of the wafer, and compressive stress results in concave curvature of the wafer. In this case, the term 'tensile stress' can be understood to be tension caused by pulling and the term 'compressive stress' can be tension caused by pressure. Although various proposals have been made for reducing the wafer bow, prior to the development set forth in this disclosure, the amount of amelioration has not been satisfactory.

SUMMARY OF THE DISCLOSURE

Objects of the Disclosure

It is an object of the present disclosure to decrease the wafer "bow" of a multijunction solar cell wafer comprising a metamorphic layer.

It is another object of the present disclosure to provide in a multijunction solar cell in which the composition of the subcells and their band gaps has been configured to maximize the It is another object of the present disclosure to provide in a multijunction solar cell in which It is another object of the present disclosure to provide in a multijunction solar cell in which It is another object of the present invention to provide an upright metamorphic four junction solar cell in which the average band gap of all four subcells is greater than 1.35 eV and the wafer "bow" has been minimized.

It is another object of the present invention to provide a four junction solar cell in which the lower two subcells are lattice mismatched and in which Some implementations of the present disclosure may incorporate or implement fewer of the aspects and features noted in the foregoing objects.

Features of the Invention

All ranges of numerical parameters set forth in this disclosure are to be understood to encompass any and all subranges or "intermediate generalizations" subsumed therein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.2, or 1.3 to 1.4, or 1.5 to 1.9 eV.

The present disclosure provides a method of manufacturing a multijunction solar cell comprising: providing a growth substrate;

forming a first solar subcell over or in the growth substrate; growing a grading interlayer over the growth substrate, followed by growing a sequence of layers of semiconductor material using a deposition process to form a solar cell comprising a plurality of subcells including a second subcell disposed over and lattice mismatched with respect to the growth substrate, and at least a third subcell disposed over the second subcell;

wherein the graded interlayer has a band gap equal to or greater than that of the second subcell and is compositionally graded to lattice match the growth substrate on one side and the second subcell on the other side; and including a plurality of N step-graded sublayers (where N is an integer and 2<N<10), wherein each successive sublayer has an incrementally greater lattice constant than the sublayer below it and grown in such a manner that N−1 sublayers are fully relaxed (i.e., not in tension or compression); wherein the uppermost sublayer of the grading interlayer has an in-plane lattice constant greater than the in-plane lattice constant of the adjacent second subcell and has an out-of-plane lattice constant greater than the in-plane lattice constant such that it is partially relaxed (i.e., in compression), growing a first wafer bowing inhibition layer directly above the uppermost sublayer of the grading interlayer incrementally to a predetermined thickness such that at such predetermined thickness the transition layer induces tensile relaxation of the transition layer in the a first crystalline lattice planar direction [by a misfit dislocation formation], thereby allowing the in-plane lattice constants of the solar subcell layers to be equal in the second and a third crystalline lattice planar directions, wherein the second and third directions are ninety degrees displaced from one another, thereby reducing the warp of the wafer.

In another aspect, the present disclosure provides a method of manufacturing a multijunction solar cell comprising: providing a growth substrate; forming a first solar subcell over or in the growth substrate; growing a grading interlayer over the growth substrate, followed by growing a sequence of layers of semiconductor material using a deposition process to form a solar cell comprising a plurality of subcells including at least a second subcell disposed over and lattice mismatched with respect to the growth substrate; wherein the graded interlayer has a band gap equal to or greater than that of the second subcell and is compositionally graded to lattice match the growth substrate on one side and the second subcell on the other side; and including a plurality of N step-graded sublayers (where N is an integer and 2<N<10), wherein each successive sublayer has an incrementally greater lattice constant than the sublayer below it and grown in such a manner that N−1 sublayers are fully relaxed (i.e., not in tension or compression); wherein the uppermost sublayer of the grading interlayer is at least twice as thick as each sublayer below it, and has an in-plane lattice constant greater than the in-plane lattice constant of the adjacent second subcell and has an out-of-plane lattice constant greater than the in-plane lattice constant such that it is strained; growing a transition layer directly above the uppermost sublayer of the grading interlayer and having a lattice constant smaller than the uppermost sublayer, wherein the growth is done incrementally to a predetermined thickness such that at such predetermined thickness the transition layer induces tensile relaxation of the transition layer in the a first crystalline lattice planar direction, thereby allowing the in-plane lattice constants of the transition layer and the solar subcell layers to be equal in second and a third crystalline lattice planar directions, wherein the second and third directions are ninety degrees displaced from one another, thereby reducing the warp of the wafer; and growing the second subcell over the transition layer such that the second subcell is lattice matched to the transition layer.

In another aspect, the present disclosure provides a method of manufacturing a multijunction solar cell comprising: providing a growth substrate; forming a first solar subcell over or in the growth substrate; growing a grading interlayer over the growth substrate, followed by growing a sequence of layers of semiconductor material using a deposition process to form a solar cell comprising a plurality of subcells including a second subcell disposed over and lattice mismatched with respect to the growth substrate, and at least a third subcell disposed over the second subcell; wherein the graded interlayer has a band gap equal to or greater than that of the second subcell and is compositionally graded to lattice match the growth substrate on one side and the second subcell on the other side; the graded interlayer being composed of any of the As, P, N, Sb based III-V compound semiconductors subject to the constraints of having the in-plane lattice parameter throughout its thickness being greater than or equal to that of the growth substrate, and includes a plurality of N step-graded sublayers (where N is an integer and 2<N<10), wherein each successive sublayer has an incrementally greater lattice constant than the sublayer below it and grown in such a manner that each sublayer is fully relaxed (i.e., not in tension or compression); growing a first wafer bowing inhibition layer directly over the uppermost sublayer of the grading interlayer, such bowing inhibition layer having an in-plane lattice constant equal to the in-plane lattice constant of the uppermost sublayer of the graded interlayer and having an out-of-plane different from the in-plane lattice constant, the wafer bowing inhibition layer having a different set of constituent elements than the directly adjacent layers above such layer and below such layer and being partially relaxed (i.e., in tension or compression), and growing a second wafer bowing inhibition layer directly over the first wafer bowing inhibition layer and having an aluminum content in excess of 50% by mole fraction of the constituent material of the second wafer bowing inhibition layer.

In some embodiments, the upper first solar subcell has a band gap of approximately 2.05, the second solar subcell has a band gap of approximately 1.55 eV; and the third solar subcell has a band gap of 1.2 eV.

In some embodiments, the lattice constant of the first wafer bowing inhibition layer in a first crystalline direction is greater than the lattice constant in a second crystalline direction that is orthogonal to the first crystalline direction.

In some embodiments, the thickness of the first wafer bowing inhibition layer is from 250 to 1000 nm.

In some embodiments, the lattice constant of the first wafer bowing inhibition layer is equal to the lattice constant of the second wafer bowing inhibition layer and of the second subcell.

In some embodiments, the first wafer bowing inhibition layer is strained in a first crystalline direction.

In some embodiments, the first wafer bowing inhibition layer is composed of InGaAs or (Al)InGaAs, with the indium content at least 0.07 per mole.

In some embodiments, the first crystalline direction is the [110] direction, and the second crystalline direction is the [1-10] direction.

In some embodiments, the graded interlayer is composed of InGaAs with the indium content in the range of 0.08 to 0.145 per mole.

In some embodiments, the second wafer bowing inhibition layer has the same lattice constant as the first bowing inhibition layer in the [1-10] direction, and a smaller lattice constant in the [110] direction.

In some embodiments, the second wafer bowing inhibition layer is composed of $Al_xIn_yGa_{1-y}As$ where $0<x<1$, $0<y<1$, and x is greater than 0.75.

In some embodiments, the second bowing inhibition layer is between 50 nm and 2000 nm in thickness, with the Al content 50 to 99% per mole.

In some embodiments, the bowing of the wafer from the center of the wafer to the edge is less than 120 microns in the worst-case direction, and less than 50 microns in the best-case direction.

In some embodiments, the first wafer bowing inhibition layer has a thickness of 750 nm.

In some embodiments, the graded interlayer is composed of InGaAs and has a thickness in the range of 100 to 500 nm.

In some embodiments, there further comprises growing a tunnel diode over the first solar subcell prior to the growth of the grading interlayer.

In some embodiments, the growth substrate is germanium and has a thickness between 140 and 500 microns.

In some embodiments, there further comprises thinning the backside of the growth substrate to a thickness of between 30 and 120 microns subsequent to the growth of the sequence of layers of semiconductor material.

In some embodiments, the grading interlayer is compositionally step-graded with between one and four steps and is composed of $In_xGa_{1-x}As$ with $0<x<1$ and x selected such that the grading interlayer has a graded band gap in the range of 1.15 to 1.41 eV, or 1.2 to 1.35 eV, or 1.25 to 1.30 eV.

In some embodiments,

In some embodiments, the first solar subcell has a band gap of 2.05 eV.

In some embodiments, the band gap of the third solar subcell is less than 1.41 eV, and greater than that of the fourth subcell.

In some embodiments, the third solar subcell has a band gap of 1.41 eV.

In some embodiments, the third solar subcell has a band gap in the range of 1.15 to 1.35 eV.

In some embodiments, the third solar subcell has a band gap in the range of 1.1 to 1.2 eV.

In some embodiments, the third solar subcell has a band gap of approximately 1.2 eV.

In some embodiments, the upper first subcell is composed of indium gallium aluminum phosphide; the second solar subcell includes an emitter layer composed of indium gallium phosphide or aluminum indium gallium arsenide, and a base layer composed of aluminum indium gallium arsenide; the third solar subcell is composed of indium gallium arsenide; and the fourth subcell is composed of germanium.

In some embodiments, there further comprises a distributed Bragg reflector (DBR) layer adjacent to and between the third and the fourth solar subcells and arranged so that light can enter and pass through the third solar subcell and at least a portion of which can be reflected back into the third solar subcell by the DBR layer.

In some embodiments, the distributed Bragg reflector layer is composed of a plurality of alternating layers of lattice matched materials with discontinuities in their respective indices of refraction.

In some embodiments, the difference in refractive indices between alternating layers is maximized in order to minimize the number of periods required to achieve a given reflectivity, and the thickness and refractive index of each period determines the stop band and its limiting wavelength.

In some embodiments, the DBR layer includes a first DBR layer composed of a plurality of p type $In_zAl_xGa_{1-x-z}As$ layers, and a second DBR layer disposed over the first DBR layer and composed of a plurality of p type $In_wAl_yGa_{1-y-x}As$ layers, where $0<x<1$, $0<y<1$, $0<z<1$ and y is greater than x.

In some embodiments, the selection of the composition of the subcells and their band gaps maximizes the efficiency at high temperature (in the range of 40 to 70 degrees Centigrade) in deployment in space at a predetermined time after the initial deployment (referred to as the beginning-of-life or (BOL), such predetermined time being referred to as the end-of-life (EOL) and being at least five years, and the average band gap (i.e., the numerical average of the lowest band gap material in each subcell) of all four subcells is greater than 1.35 eV.

In some embodiments, at least one of the upper sublayers of the graded interlayer has a larger lattice constant than the adjacent layers to the upper sublayer disposed above the grading interlayer.

In some embodiments, the difference in lattice constant between the adjacent third and fourth subcells is in the range of 0.1 to 0.2 Angstroms.

In some embodiments, there further comprises at least a first threading dislocation inhibition layer having a thickness in the range of 0.10 to 1.0 microns and disposed over said second solar subcell.

In some embodiments, there further comprises at least a second threading dislocation inhibition layer having a thickness in the range of 0.10 to 1.0 micron and composed of InGa(Al)P, the second threading dislocation inhibition layer being disposed over and directly adjacent to said grading interlayer for reducing the propagation of threading dislocations, said second threading dislocation inhibition layer having a composition different from a composition of the first threading dislocation inhibition layer.

In some embodiments, additional layer(s) may be added or deleted in the cell structure without departing from the scope of the present disclosure.

Some implementations of the present disclosure may incorporate or implement fewer of the aspects and features noted in the foregoing summaries.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
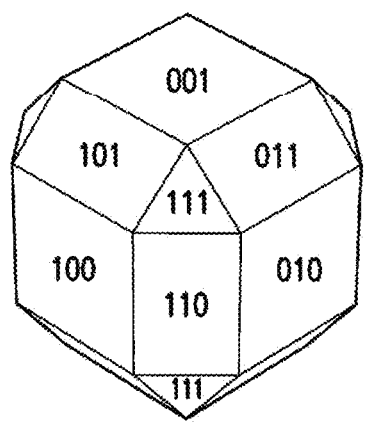
FIG. 1 is a perspective view of a polyhedral representation of a semiconductor lattice structure showing the crystal planes.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material. More particularly, the expression "band gap" of a solar subcell, which internally has layers of different band gaps shall be defined to mean the band gap of the layer of the solar subcell in which the majority of the charge carriers are generated (such sublayer typically being the p-type base semiconductor layer of the base/emitter photovoltaic junction of such subcell). In the event such layer in turn has sublayers with different band gaps (such as the case of a base layer having a graded composition and more particularly a graded band gap), the sublayer of that solar subcell with the lowest band gap shall be taken as defining the "band gap" of such a subcell. Apart from a solar subcell, and more generally in the case of a specifically designated semiconductor region (such as a metamorphic layer), in which that semiconductor region has sublayers or subregions with different band gaps (such as the case of a semiconductor region having a graded composition and more particularly a graded band gap), the sublayer or subregion of that semiconductor region with the lowest band gap shall be taken as defining the "band gap" of that semiconductor region.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density Jsc through a solar subcell through a given planar area, or volume, of semiconductor material constituting the solar subcell.

"Deposited", with respect to a layer of semiconductor material, refers to a layer of material which is epitaxially grown over another semiconductor layer.

"Dopant" refers to a trace impurity element that is contained within a semiconductor material to affect the electrical or optical characteristics of that material. As used in the context of the present disclosure, typical dopant levels in semiconductor materials are in the $10^{16}$ to $10^{19}$ atoms per cubic centimeter range. The standard notation or nomenclature, when a particular identified dopant is proscribed, is to use, for example, the expression "GaAs:Se" or "GaAs:C" for selenium or carbon doped gallium arsenide respectively. Whenever a ternary or quaternary compound semiconductor is expressed as "AlGaAs" or "GaInAsP", it is understood that all three or four of the constituent elements are much higher in mole concentration, say on the 1% level or above, which is in the $10^{21}$ atoms/cm$^{-3}$ or larger range. Such constituent elements are not considered "dopants" by those skilled in the art since the atoms of the constituent element form part of the crystal structure of the compound semiconductor. In addition, a further distinction is that a dopant has a different valence number than the constituent component elements. In a commonly implemented III-V compound semiconductor such as AlGaInAs, none of the individual elements Al, Ga, In, or As are considered to be dopants since they have the same valence as the component atoms that make up the crystal lattice.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in—plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Space qualified" refers to an electronic component (e.g., as used in this disclosure, to a solar cell) that provides satisfactory operation under the high temperature and thermal cycling test protocols that establish typical "qualification" requirements for use by customers who utilize such components in the outer space environment. The exemplary conditions for such qualifications include (i) vacuum bake-out testing that includes exposure to a temperature of +100° C. to +135° C. (e.g., about +100° C., +110° C., +120° C., +125° C., +135° C.) for 2 hours to 24 hours, 48 hours, 72 hours, or 96 hours; and (ii) TVAC and/or APTC test that includes cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10.1109/PVSC 2013 6745052).

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of metamorphic multijunction solar cells (as well as inverted metamorphic multijunction solar cells) are disclosed in the related applications noted above. Some, many or all of such features may be included in the structures and processes associated with the "upright" solar cells of the present disclosure. However, more particularly, the present disclosure is directed to the fabrication of a metamorphic multijunction solar cell grown on a single growth substrate, including in one embodiment the two lower subcells being lattice mismatched, and minimizing the bow or warp of the resulting wafer. More specifically, however, in some embodiments, the present disclosure relates to four junction solar cells with direct band gaps in the range of 2.0 to 2.15 eV (or higher) for the top subcell, and (i) 1.65 to 1.8 eV, and (ii) 1.41 eV or less, for the middle subcells, and (iii) 0.6 to 0.8 eV indirect bandgaps for the bottom subcell, respectively, with a metamorphic layer between the middle subcells and the bottom subcell.

The present disclosure, similar to the parent and related applications of Applicant, provides an unconventional four junction design (with three grown lattice matched subcells, which are lattice mismatched to the Ge substrate) that leads to a surprising reduction in bow and warp, as well as achieving a substantial performance improvement over that of traditional three junction solar cell on Ge despite the substantial lattice mismatch present between the top three junctions and the bottom Ge junction. This performance gain is especially realized at high temperature and after high exposure to space radiation by the proposal of incorporating high band gap semiconductors that are inherently more resistant to radiation and temperature, thus specifically addressing the problem of ensuring continues adequate efficiency and power output at the "end-of-life".

In some embodiments, the fourth subcell is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN. InGaSbBiN or other III-V or II-VI compound semiconductor material.

The indirect band gap of germanium at room temperature is about 0.66 eV, while the direct band gap of germanium at room temperature is 0.8 eV. Those skilled in the art will normally refer to the "band gap" of germanium as 0.67 eV, since it is lower than the direct band gap value of 0.8 eV. The recitation that "the fourth subcell has a direct band gap of greater than 0.75 eV" is therefore expressly meant to include germanium as a possible semiconductor for the fourth subcell, although other semiconductor material can be used as well.

More specifically, the present disclosure intends to provide a relatively simple and reproducible technique either for "upright" processing, or inverted processing associated with inverted metamorphic multijunction solar cells, that is suitable for use in a high volume production environment in which various semiconductor layers are grown on a growth substrate in an MOCVD reactor, and subsequent processing steps are defined and selected to minimize the wafer "bow" and physical stress and any physical damage to the quality of the deposited layers, thereby simplifying wafer handling and ensuring a relatively high yield of operable solar cells meeting specifications at the conclusion of the fabrication processes.

As suggested above, incremental improvements in the design of multijunction solar cells are made in view of a variety of new space missions and application requirements. Moreover, although such improvements may be relatively minute quantitative modifications in the composition, lattice constant, or band gap of certain subcells or adjoining layers, as we noted above, such minute parametric changes can provide substantial improvements in efficiency that specifically address the "problems" that have been identified associated with the existing current commercial multijunction solar cells, and provide a "solution" that represents an "inventive step" in the design process.

Prior to discussing the specific embodiments of the present disclosure, a brief discussion of some of the issues associated with the design of multijunction solar cells in the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

FIG. 1A is a perspective view of a polyhedral representation of a semiconductor lattice structure showing the crystal planes. The Miller indices are used to identify the planes, and the crystal structure is represented in the Figure by a truncated cube with the (001) plane at the top. In the case of a GaAs compound semiconductor, which is the material of interest in the present invention, the crystal structure is known as the zinc blended structure, and is shown in FIG. 1B, which represents a combination of two penetrating face centered cubic sublattices. The lattice constant (i.e., the distance between the arsenic atoms in the crystal) is 0.565 nm.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2A:
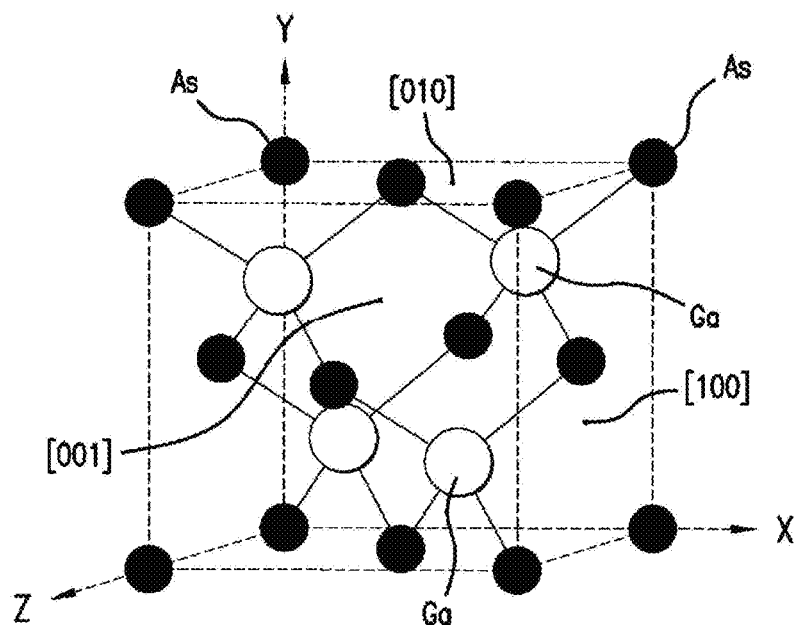
FIG. 2A is a perspective view of GaAs crystal lattice showing the position of the gallium and arsenic atoms.

FIG. 2A is a perspective view of the GaAs crystal lattice showing the position of the gallium and arsenic atoms, with the corresponding Miller indices identifying the lattice planes.

Figure 2B:
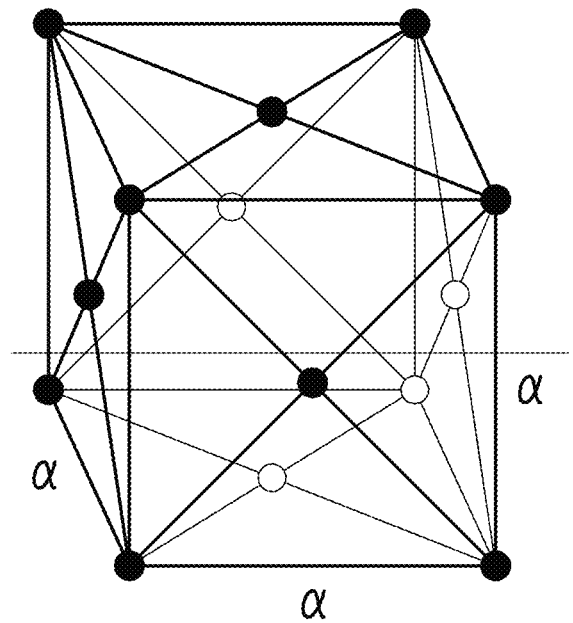
FIG. 2B is a perspective view of the germanium crystal lattice showing the position of the germanium atoms.

FIG. 2B is a perspective view of the germanium crystal lattice showing the position of the germanium atoms.

Figure 3A:
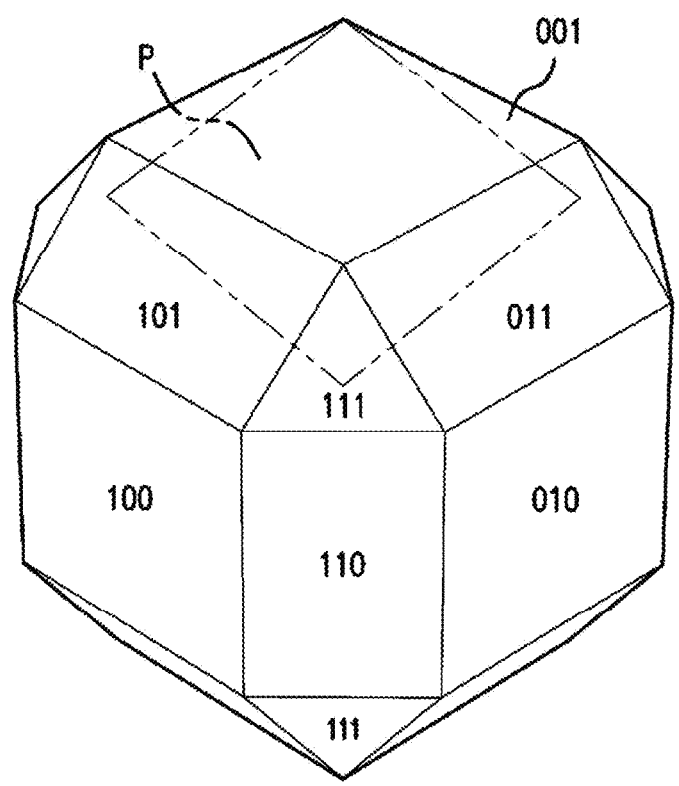
FIG. 3A is a perspective depiction of the polyhedral representation of FIG. 1 illustrating surface of the plane P of the substrate employed in the present disclosure.

FIG. 3A is a perspective view of the plane P of the substrate surface employed in the present invention superimposed over the crystal diagram of FIG. 1A. The plane P is seen to pivot from a point on the (001) plane (in this representation, the rear corner of the top surface of the polyhedron) in the direction of the (111) plane, or more accurately the (111)A plane, where the letter "A" refers to the plane formed by the sublattice of arsenic atoms. The angle of pivot according to the present invention defines the angle of off-cut of the substrate defined from the (001) plane by the plane P, which is at least 6.degree. and preferably approximately 15.degree.

Although the present invention ideally provides for an offcut in the [111]A direction, it may be that during production and fabrication of various wafer lots, the alignment or cutting process is not as precise or exacting as may be specified by the present invention, and the resulting plane P may pivot slightly in the direction of the adjacent (011) or (101) planes, as well as in the direction of the (111)A plane. Such deviations, whether inadvertent or for some other mechanical or structural reason, are contemplated to be within the scope of the present invention as well.

Figure 3B:
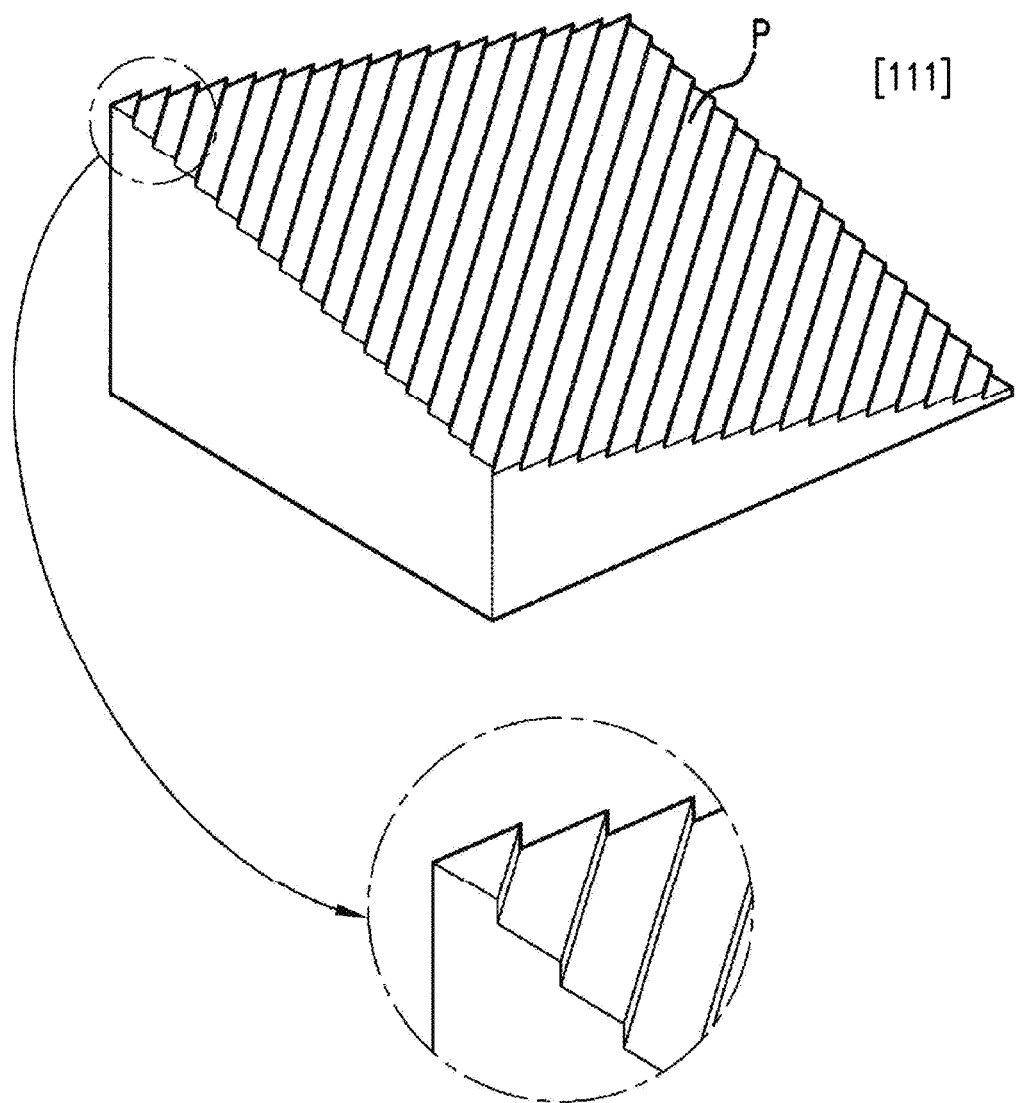
FIG. 3B is an enlarged view of the plane P depicted in FIG. 3A.

FIG. 3B is an enlarged view of the plane P of FIG. 3A.

Figure 4:
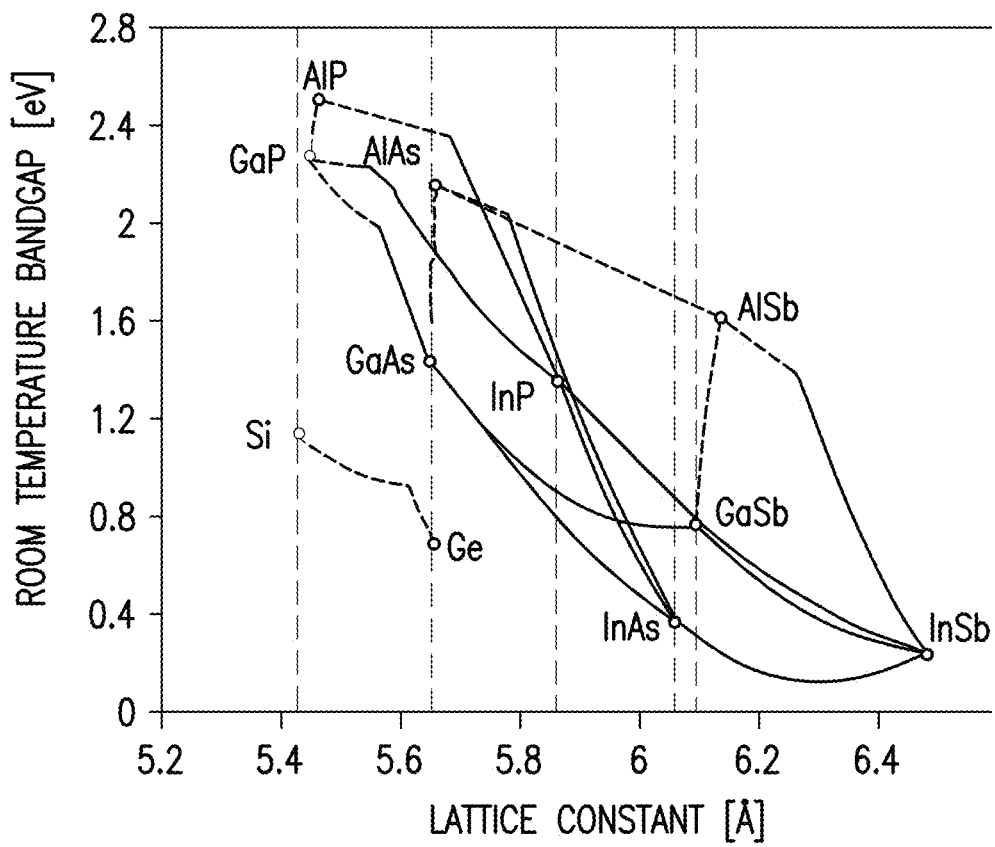
FIG. 4 is a graph representing the band gap of certain binary materials and their lattice constants.

FIG. 4 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

Figure 5:
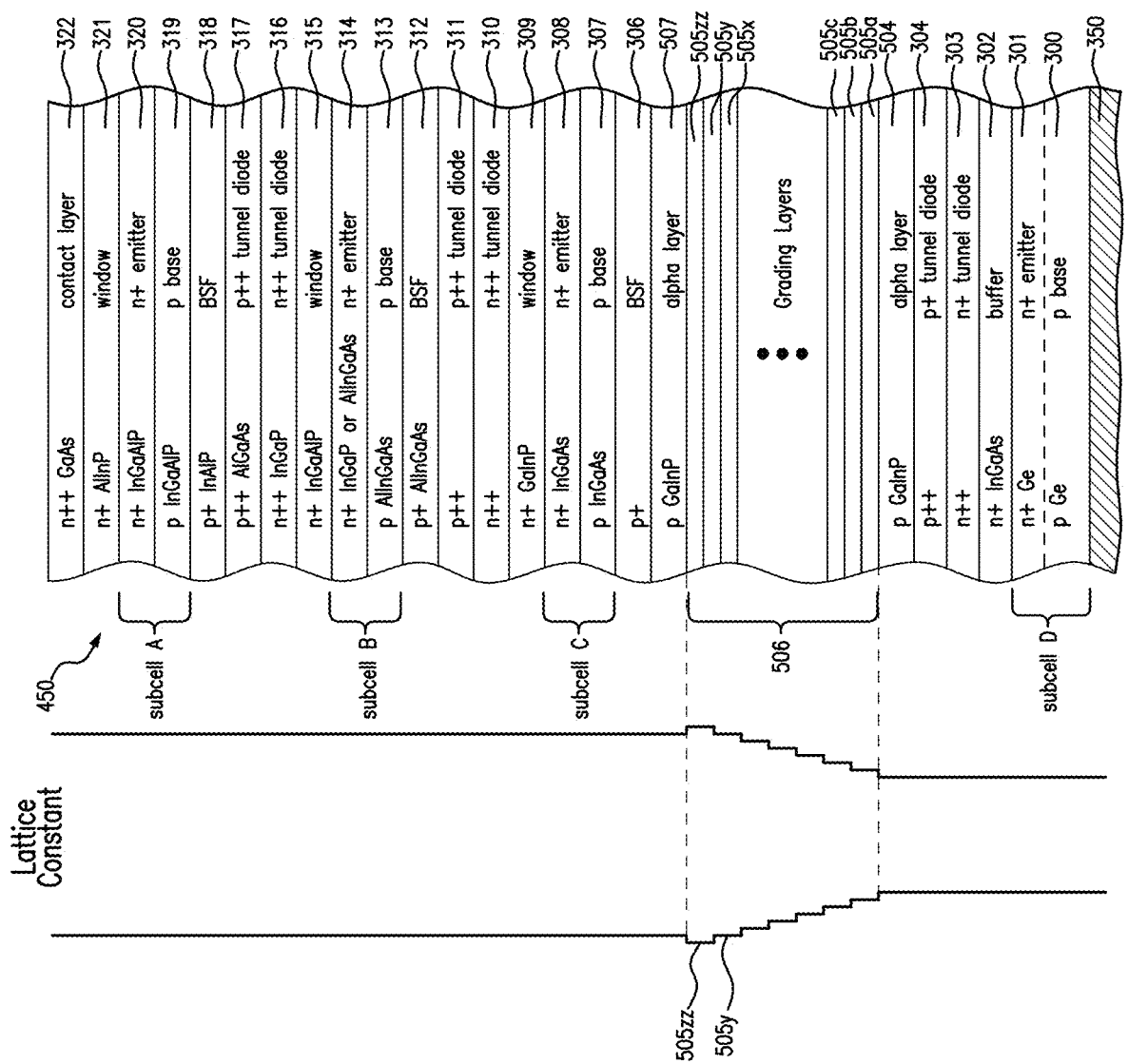
FIG. 5 is a cross-sectional view of an embodiment of a typical upright metamorphic four junction solar cell after several stages of fabrication including the deposition of certain semiconductor layers on the growth substrate up to the contact layer.
Figure 6:
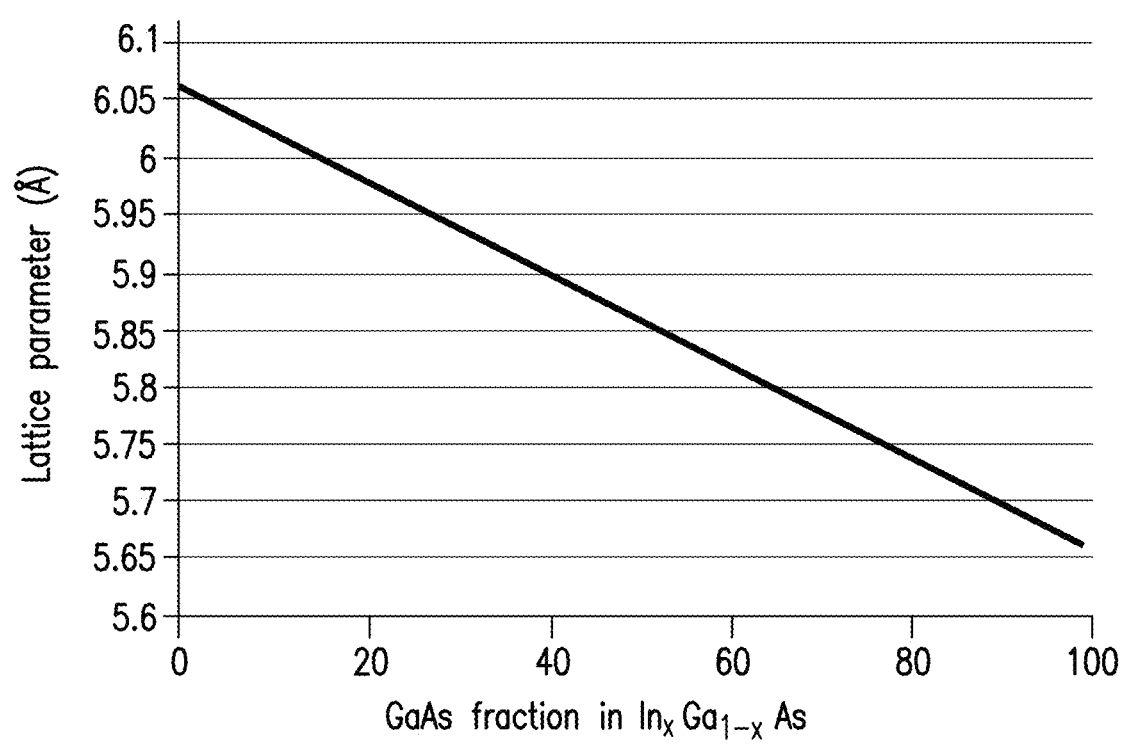
FIG. 6 is a graph depicting the lattice constant of $In_xGa_{1-x}As$ for various values of x plotted along the x-axis.
Figure 7:
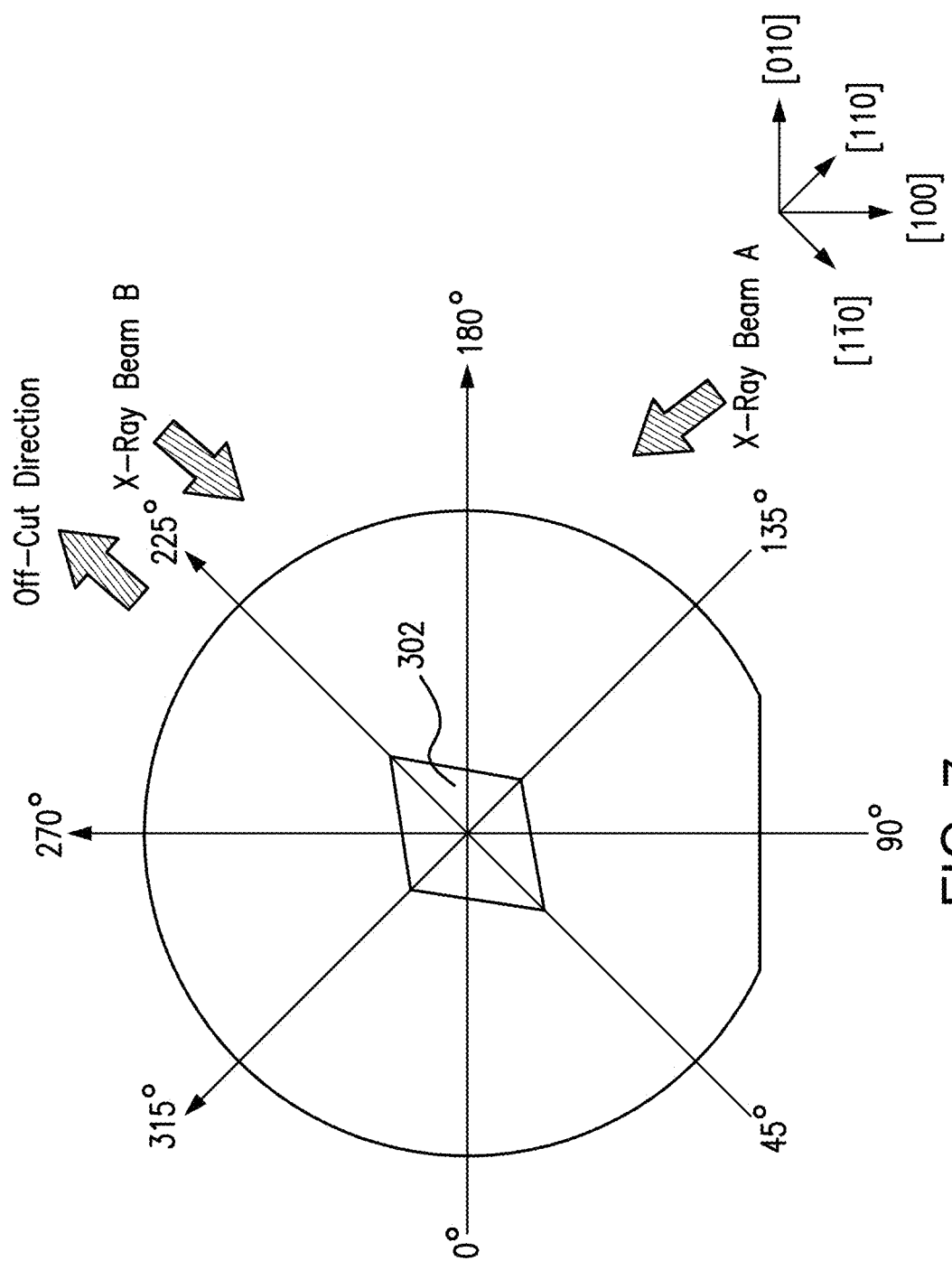
FIG. 7 is a top plan view of a semiconductor wafer illustrating the different crystalline directions and directions of x-ray scans measured on the wafer.

Turning to a representative upright metamorphic multijunction (UMM) solar cell device that will illustrate the issues of bow or warping, FIG. 5 is a cross-sectional view of an embodiment of a four junction solar cell 450 after several stages of fabrication including the growth of certain semiconductor layers on the growth substrate up to the contact layer 322.

As shown in the illustrated example of FIG. 5, the bottom or fourth subcell D includes a growth substrate 300 formed of p-type germanium ("Ge") which also serves as a base layer. A back metal contact pad 350 formed on the bottom of base layer 300 provides electrical contact to the multijunction solar cell 200. The bottom subcell D, further includes, for example, a highly doped n-type Ge emitter layer 301, and an n-type indium gallium arsenide ("InGaAs") nucleation layer 302. The nucleation layer is deposited over the base layer, and the emitter layer is formed in the substrate by diffusion of dopants into the Ge substrate, thereby forming the n-type Ge layer 301. Heavily doped p-type aluminum indium gallium arsenide ("AlGaAs") and heavily doped n-type gallium arsenide ("GaAs") tunneling junction layers 304, 303 may be deposited over the nucleation layer to provide a low resistance pathway between the bottom and middle subcells.

In the embodiment depicted, an intermediate graded interlayer 506, comprising in one embodiment step-graded sublayers 505a through 505zz, is disposed over the tunnel diode layer 303/304. In particular, the graded interlayer provides a transition in the in-plane lattice constant from the lattice constant of the substrate subcell D to the larger lattice constant of the middle and upper subcells C, B and A.

At least a first "alpha" or threading dislocation inhibition layer 504, preferably composed of p-type InGaP, is deposited over the tunnel diode 303/304, to a thickness of from 0.10 to about 1.0 micron. Such an alpha layer is intended to prevent threading dislocations from propagating, either opposite to the direction of growth into the bottom subcell D, or in the direction of growth into the subcell C, and is more particularly described in U.S. Patent Application Pub. No. 2009/0078309 A1 (Cornfeld et al.). More generally, the alpha layer has a different composition than the adjacent layers above and below it.

The metamorphic layer (or graded interlayer) 506 is deposited over the alpha layer 504 using a surfactant. Layer 506 is preferably a compositionally step-graded series of p-type InGaAs or InGaAlAs layers, preferably with monotonically changing lattice constant, so as to achieve a gradual transition in lattice constant in the semiconductor structure from subcell D to subcell C while minimizing threading dislocations from occurring. In one embodiment, the band gap of layer 506 is constant throughout its thickness, preferably approximately equal to 1.22 to 1.34 eV, or otherwise consistent with a value slightly greater than the band gap of the middle subcell C. In another embodiment, the band gap of the sublayers of layer 506 vary in the range of 1.22 to 1.34 eV, with the first layer having a relatively high band gap, and subsequent layers incrementally lower band gaps. One embodiment of the graded interlayer may also be expressed as being composed of $In_xGa_{1-x}As$, with $0<x<1$, $0<y<1$, and x and y selected such that the band gap of the interlayer remains constant at approximately 1.22 to 1.34 eV or other appropriate band gap.

The advantage of utilizing a constant bandgap material such as InGaAs is that arsenide-based semiconductor material is much easier to process in standard commercial MOCVD reactors.

In one embodiment, aluminum is added to one sublayer to make one particular sublayer harder than another, thereby forcing dislocations in the softer material.

In the surfactant assisted growth of the metamorphic layer 506, a suitable chemical element is introduced into the reactor during the growth of layer 506 to improve the surface characteristics of the layer. In the preferred embodiment, such element may be a dopant or donor atom such as selenium (Se) or tellurium (Te). Small amounts of Se or Te are therefore incorporated in the metamorphic layer 506, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 506.

Although the described embodiment utilizes a plurality of layers of InGaAs for the metamorphic layer 506 for reasons of manufacturability and radiation transparency, other embodiments of the present disclosure may utilize different material systems to achieve a change in lattice constant from subcell C to subcell D. Other embodiments may utilize continuously graded, as opposed to step graded, materials. More generally, the graded interlayer may be composed of any of the As, P, N, Sb based III-V compound semiconductors subject to the constraints of having the in-plane lattice parameter less than or equal to that of the third solar subcell C and greater than or equal to that of the fourth solar subcell D. In some embodiments, the layer 505 has a band gap energy greater than that of the third solar subcell C, and in other embodiments has a band gap energy level less than that of the third solar subcell C.

In some embodiments, a second "alpha" or threading dislocation inhibition layer 507, preferably composed of p type GaInP, is deposited over metamorphic buffer layer 506, to a thickness of from 0.10 to about 1.0 micron. Such an alpha layer is intended to prevent threading dislocations from propagating, either opposite to the direction of growth into the fourth subcell D, or in the direction of growth into the third subcell C, and is more particularly described in U.S. Patent Application Pub. No. 2009/0078309 A1 (Cornfeld et al.).

In the specific embodiment depicted in FIG. 5, the top or uppermost sublayer 505zz of the graded interlayer 506 is strained or only partially relaxed, and has a lattice constant which is greater than that of the layer above it, i.e., the alpha layer 507 (should there be a second alpha layer) or the BSF layer 306. In short, in this embodiment, there is an "overshoot" of the last one sublayer 505zz of the grading sublayers, as depicted on the left hand side of FIG. 4B, which shows the step-grading of the lattice constant becoming larger from layer 505a to 505zz, and then decreasing back to the lattice constant of the upper layers 507 through 322.

In the illustrated example of FIG. 5, the third subcell C includes a highly doped p-type aluminum indium gallium arsenide ("AnnGaAs") back surface field ("BSF") layer 306, a p-type InGaAs base layer 307, a highly doped n-type indium gallium arsenide ("InGaAs") emitter layer 308 and a highly doped n-type indium aluminum phosphide ("AlInP$_2$") or indium gallium phosphide ("GaInP") window layer 309. The InGaAs base layer 307 of the subcell C can include, for example, approximately 1.5% In. Other compositions may be used as well. The base layer 307 is formed over the BSF layer 306 after the BSF layer is deposited over the DBR layers 305.

The window layer 309 is deposited on the emitter layer 308 of the subcell C. The window layer 309 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 310, 311 may be deposited over the subcell C.

The second subcell B includes a highly doped p-type aluminum indium gallium arsenide ("AlInGaAs") back surface field ("BSF") layer 312, a p-type AlInGaAs base layer 313, a highly doped n-type indium gallium phosphide ("InGaP$_2$") or AlInGaAs layer 314 and a highly doped n-type indium gallium aluminum phosphide ("AlGaAlP") window layer 315. The InGaP emitter layer 314 of the subcell B can include, for example, approximately 50% In. Other compositions may be used as well.

Before depositing the layers of the top or upper first cell A, heavily doped n-type InGaP and p-type AlGaAs tunneling junction layers 316, 317 may be deposited over the subcell B. In the illustrated example, the top subcell A includes a highly doped p-type indium aluminum phosphide ("InAlP$_2$") BSF layer 318, a p-type InGaAlP base layer 319, a highly doped n-type InGaAlP emitter layer 320 and a highly doped n-type InAlP$_2$ window layer 321. The base layer 319 of the top subcell A is deposited over the BSF layer 318 after the BSF layer 318 is formed.

After the cap or contact layer 322 is deposited, the grid lines are formed via evaporation and lithographically patterned and deposited over the cap or contact layer 322.

Metamorphic grades are useful for both IMM and UMM architectures but understanding how they affect wafer bow has been largely ignored because thick GaAs substrates have traditionally been used for IMM. Minimizing bow allows reduction of the GaAs substrate thickness with some benefit to raw material cost and waste disposal cost following removal of the epitaxy from the substrate. In addition, wafer bow has an enormous impact on manufacturability, as addressed earlier, also benefitting product cost.

Wafer bow, or warp, is defined as the maximum difference between peak wafer deflections measured along the 0°, 45°, 90°, and 135° directions. The measurement directions with respect to the crystalline orientation of the wafer are shown in FIG. 8A.

Figure 8C:
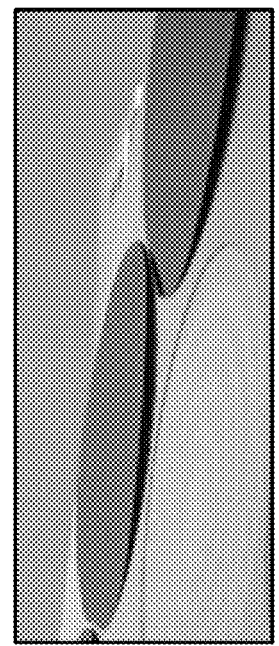
FIG. 8C is a photograph of the wafer of the solar cell of FIG. 5 on the growth plate illustrating the warp of the wafer.
Figure 8B:
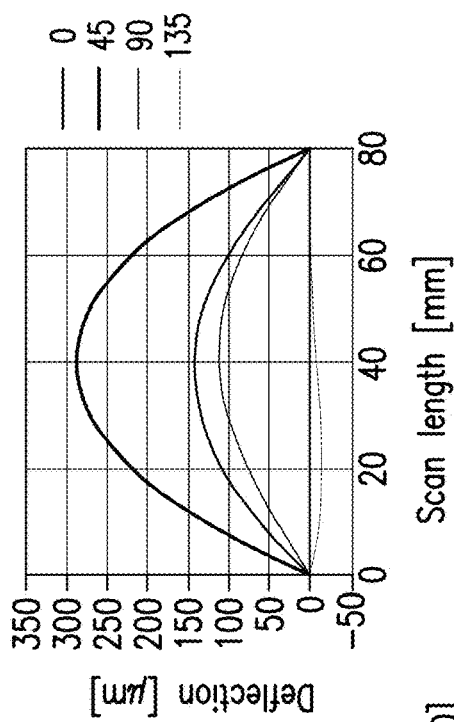
FIG. 8B is a graph depicting the x-ray measurements of the solar cell of FIG. 5 along four different scan directions indicated in FIG. 8A.
Figure 8A:
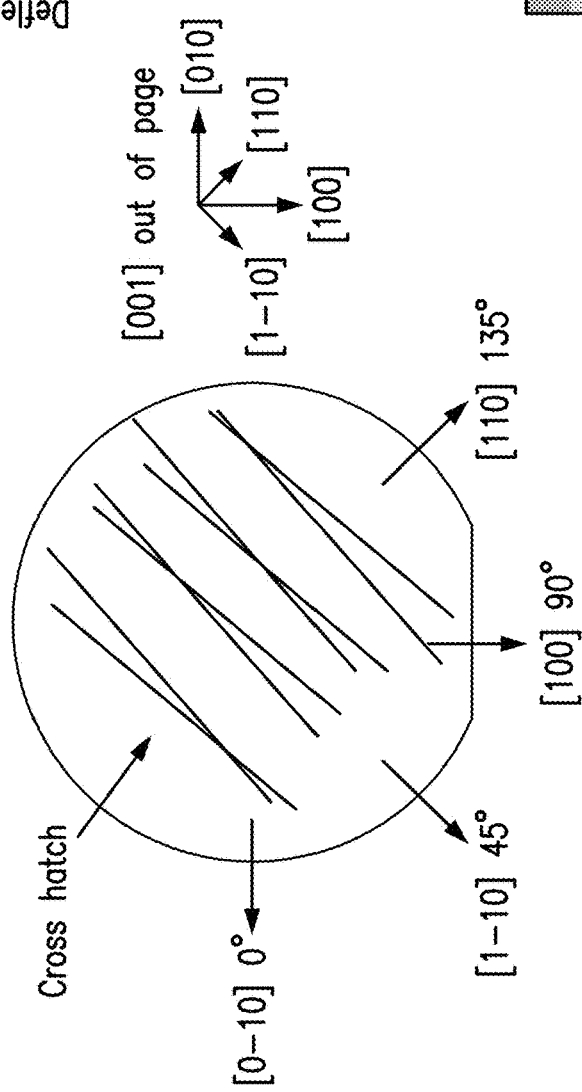
FIG. 8A is another simplified top plan view of a semiconductor wafer illustrating the different crystalline directions and directions of x-ray scans measured on the wafer.

FIG. 8A shows the crystal and directional orientation of a Ge wafer used for upright metamorphic products. X-ray measurements are conducted incident to [1-10] and [110] directions.

FIG. 8B is a graph depicting the bow of the wafer by measurements taken along four directions (0°, 45°, 90°, 135°), indicating wafers are not uniformly bowed. FIG. 8B illustrates the geometry and measured deflection of a typical prior art UMM structure in compression. It is clear that deflections are not equal along all directions and the wafer is warped or not uniformly bowed as a result. Less than 100 µm of net compressive (positive) bow or less than 50 mm of net negative tensile (negative) bow is required to avoid wafer breakage on the production line.

FIG. 8C is a photographic image of extremely warped prototype wafers resting on a growth platter.

Figure 9A:
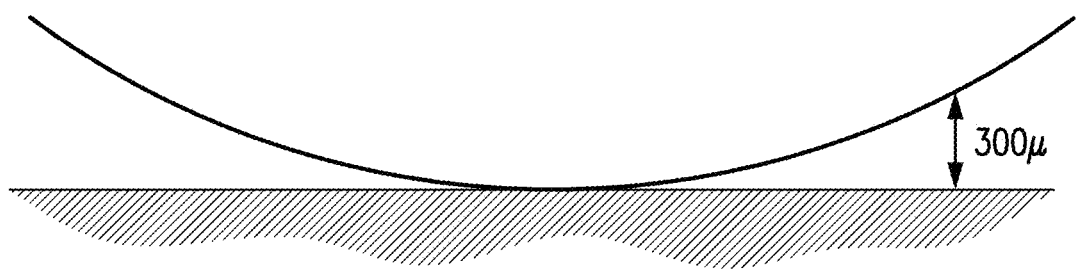
FIG. 9A is a highly simplified cross-sectional representation of the warp of the wafer of FIG. 8A along one measured x-ray direction.
Figure 9B:
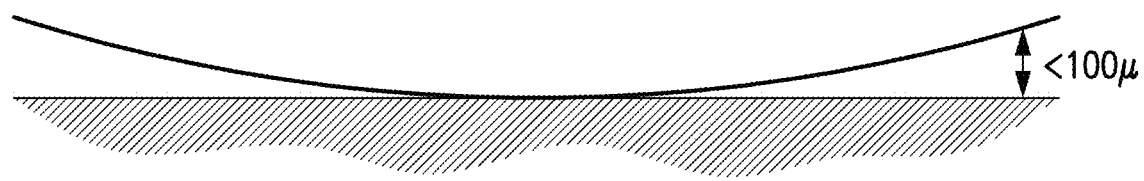
FIG. 9B is a highly simplified cross-sectional representation of the warp of the wafer of FIG. 8A along one measured x-ray direction after implementation of the semiconductor layers of the present disclosure.

FIGS. 9A and 9B are cross-sections of a wafer along one of the measured directions to illustrate the actual amount of bow in a test semiconductor wafer. FIG. 9A depicts a wafer with a metamorphic layer grown according to techniques prior to the present disclosure, indicating a bow or displacement of the edges of the wafer in excess of 300 microns.

FIG. 9B depicts a wafer with a metamorphic layer grown according to techniques according to the present disclosure, indicating a bow or displacement of the edges of the wafer is less than 100 microns.

The difficulty of engineering wafer bow is due to an apparent asymmetry of threading dislocation glide velocity in (111) glide planes of InGaAs [this asymmetric has been described in France, R. M., et al. "Control of Misfit Dislocation Glide Plane Distribution during Strain Relaxation of CuPt-Ordered GaInAs and GaInP." Journal of Applied Physics, vol. 112, no. 2, 2012, p. 023520, doi:10.1063/1.4739725]. This phenomenon is observable from the data in FIGS. 10A and 10B which shows that the reciprocal lattice constants $Q_x$ and $Q_z$ of the final buffer layer (or overshoot layer) are not equivalent; relaxation in the [1-10] direction is greater, resulting in a larger lattice constant in that direction, and a smaller lattice constant in the [110] direction. This is only observable when two RSMs are measured. In turn, the overshoot asymmetry causes a difference between the in-plane lattice constants of the solar cell layers. Epitaxial strain builds up with increasing epitaxy thickness and wafer bow (warp) results. To reduce bow, in-plane lattice constants of thick solar cell layers should be engineered to be equal ($Q_x=Q_z$) to overcome the asymmetric warp of the thin grade.

Figure 11:
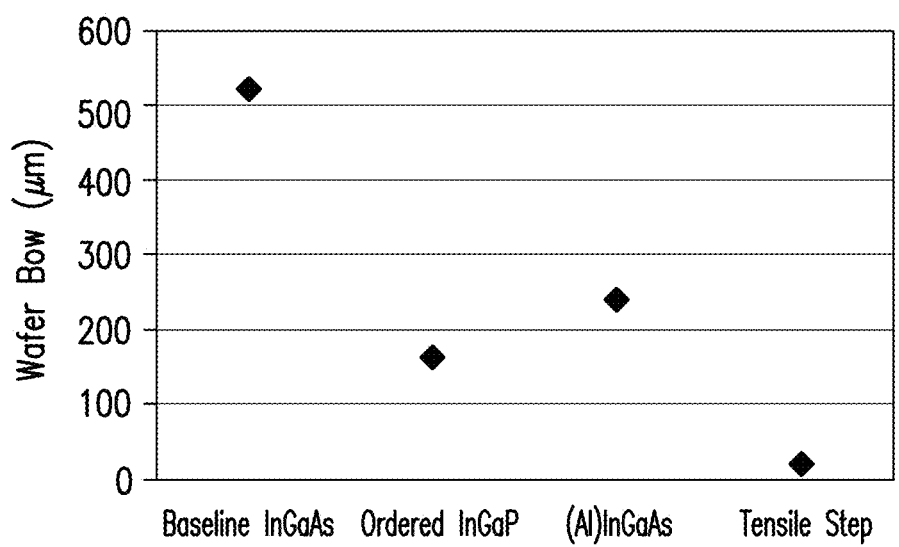
FIG. 11 is a graph depicting the wafer bow of various wafers with different compositions of the metamorphic and adjacent layers according to the present disclosure.

A graded buffer with symmetric in-plane relaxation was targeted by changing the material system of the grade (as indicated by the examples listed along the x-axis in FIG. 11). Whereas disordered InGaP is extremely resistant to relaxation, ordered InGaP relaxes asymmetrically, like InGaAs, but in the opposite direction and therefore the present disclosure takes advantage of that phenomena to counterbalance the asymmetry of an InGaAs grade. Unfortunately, this approach produced large voltage losses, likely due to glide plane switching in the buffer sublayers, and such approach would not provide the desired efficiency of the solar cell.

Figure 10A:
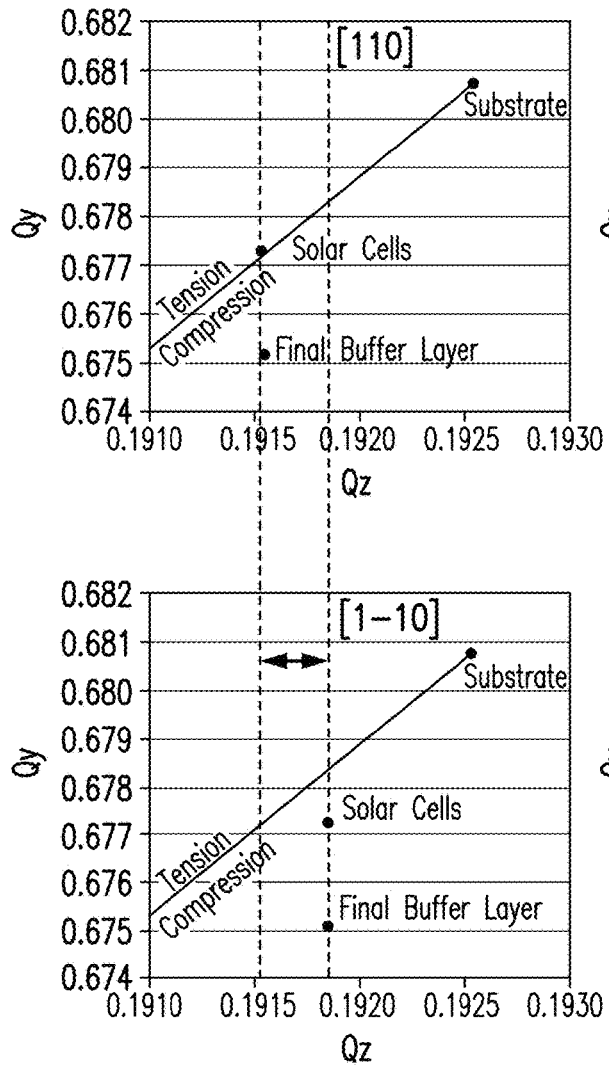
FIG. 10A is a graph of reciprocal space maps in the [110] and [1-10] directions of the solar cell of FIG. 5.

FIG. 10A is a plot of the HRXRD reciprocal space maps in the [110] and [1-10] crystal directions of baseline (bowed) UMM structures with InGaAs grades. The relaxation percentage in the final buffer layer is different in these two orthogonal directions, leading to different in-plane lattice constants illustrated by the blue arrow. This asymmetry causes wafer bow (warp).

Figure 10B:
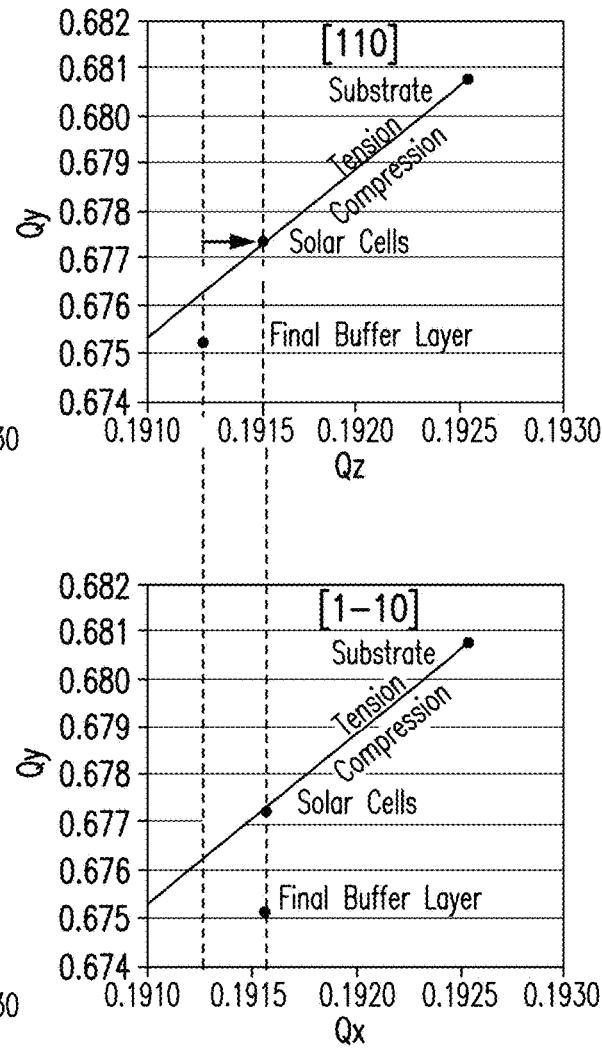
FIG. 10B is a graph of reciprocal space maps in the [110] and [1-10] direction for the solar cell of the present disclosure.

FIG. 10B is a plot of the HRXRD reciprocal space maps of the "tensile step" method of strain relief, according to the present disclosure. The black arrow on the [1-10] plot signifies decoupling of the lattice constants of the final overshoot buffer layer and the solar cells. The solar cell layers have equal in-plane lattice constants $Q_x=Q_z$ that result in almost no bow, demonstrating the effectiveness of the approach of the present disclosure.

Compared to "traditional" UMM structures, like that shown in FIG. 5, the indium content of the overshoot layer in a typical four junction solar cell is increased significantly and tensile relaxation in the [1-10] direction is intentionally induced at the interface between the overshoot layer and the epi layer directly above. This results in equal in-plane lattice constants for the thick solar cell layers ($Q_x=Q_z$), producing wafers with virtually no bow.

To explain this approach further, a first bow inhibiting layer is grown over the traditional metamorphic structure is grown with increased indium content (e.g. at least 0.07 per mole indium) in the overshoot, ensuring after growth that the solar cell layers in the lattice direction with the least relaxation ([110] in InGaAs) remain strain-free.

In the [1-10] direction, tensile strain caused by the increased indium in the overshoot is measured. Then, a second wafer bow inhibition layer with high aluminum AlInGaAs layer is grown directly above the overshoot layer which allows tensile strain in the AlInGaAs layer to be relieved at the interface.

RSMs of the final device in the [110] and [1-10] directions are shown in FIG. 10B, clearly illustrating the overshoot layer having a larger lattice constant (smaller $Q_z$) than the solar cell layers in the [1-10] direction. Since $Q_x=Q_z$ for the solar cell layers, wafer bow is virtually eliminated and cell performance remains unaffected.

FIG. 11 depicts the wafer bow of UMM structures grown with different metamorphic buffer designs. Data was acquired on traditional 140 micron thick Ge substrates. The tensile step approach according to the present disclosure achieves wafer flatness on par with traditional cells on crystalline Ge substrates.

Figure 12:
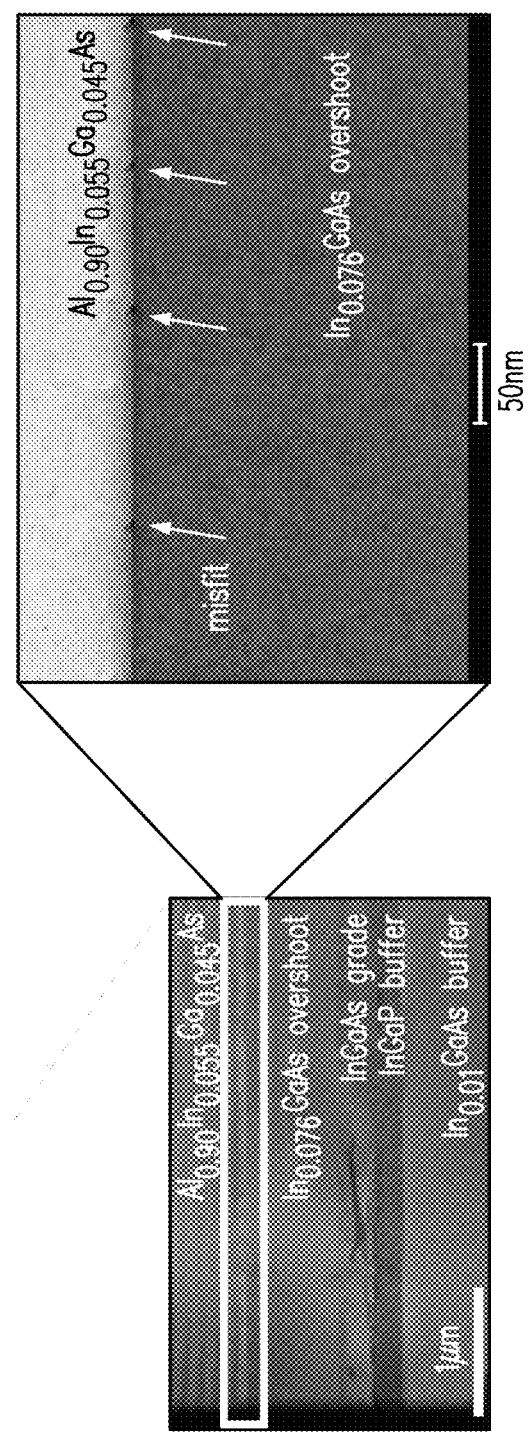
FIG. 12 is a cross-sectional TEM images of the [1-10] crystal plane of a solar cell according to the present disclosure exhibiting misfit dislocation formation at the interface between the InGaAs overshoot layer and a high Al composition AlInGaAs layer.

FIG. 12 depicts a TEM image that shows misfit dislocation formation between the overshoot and the overlying cell layers along the [1-10] direction resulting from the tensile relaxation.

Figure 13:
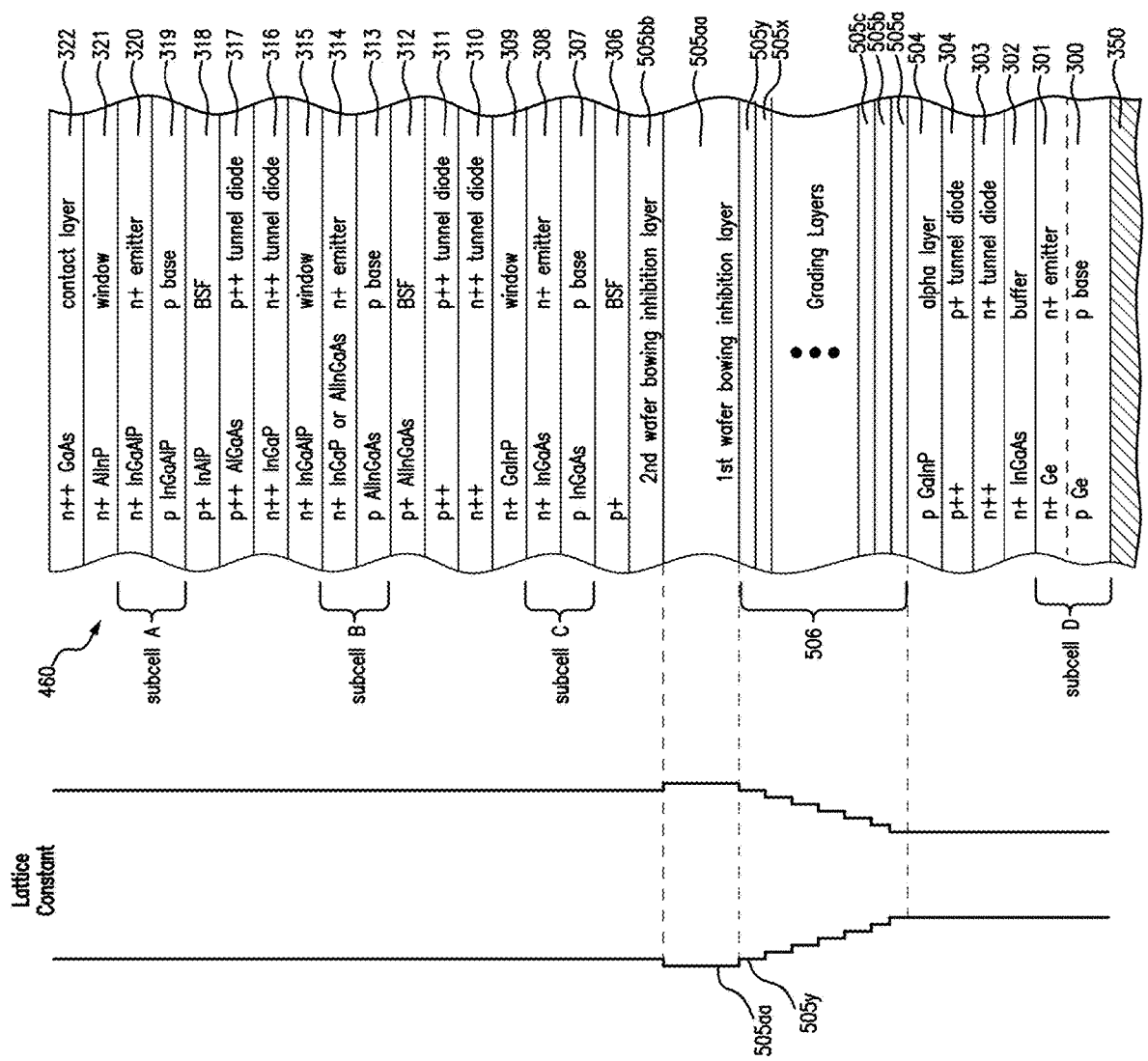
FIG. 13 is a cross-sectional view of an embodiment of an upright metamorphic four-junction solar cell according to the present disclosure.
Figure 14A:
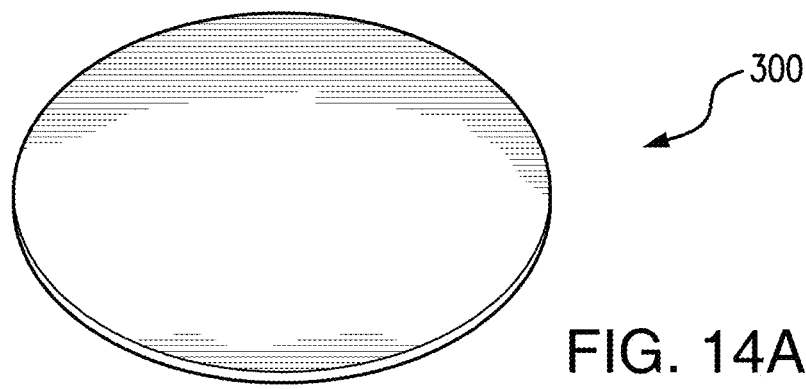
FIG. 14A is a perspective view of a wafer prior to the growth of metamorphic layers.
Figure 14B:
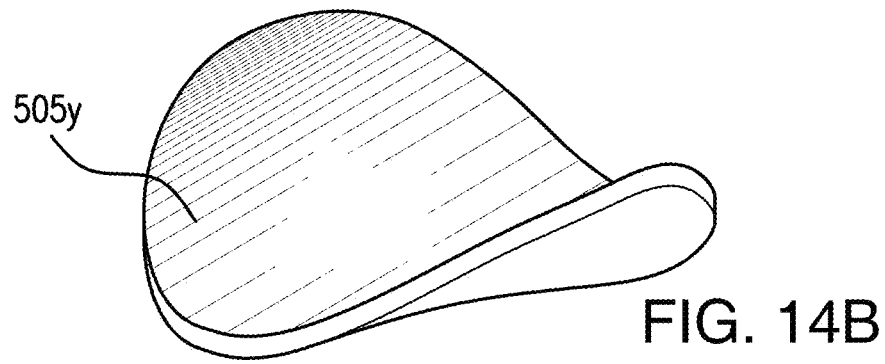
FIG. 14B is a perspective view of the wafer of FIG. 14A after the growth of the metamorphic layers.
Figure 14C:
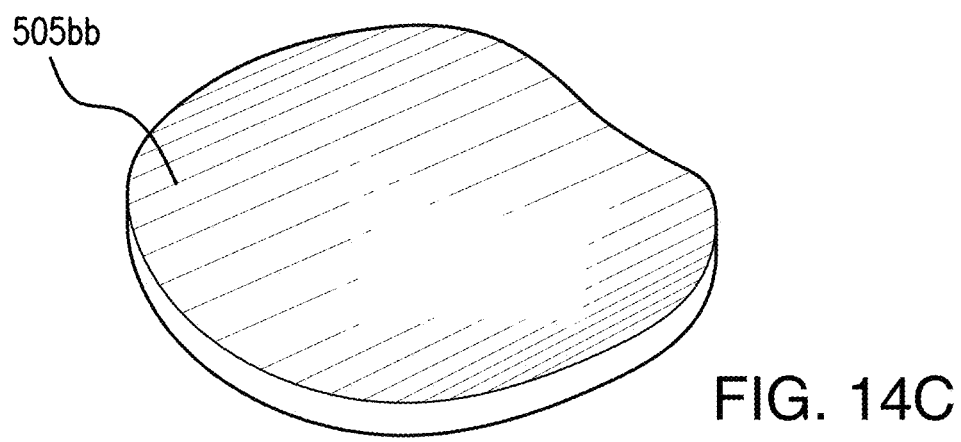
FIG. 14C is a perspective view of the wafer of FIG. 14B after the growth of the first and second bowing inhibition layers according to the present disclosure.
Figure 15A:
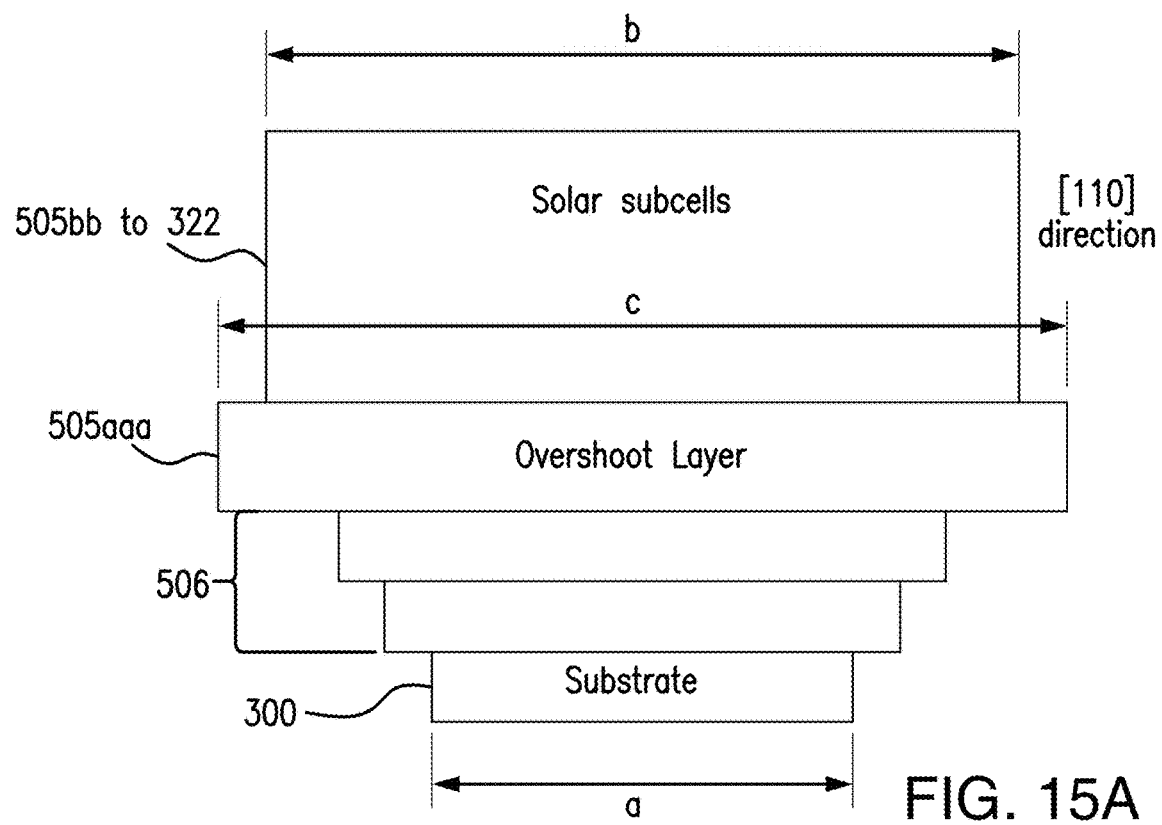
FIG. 15A is a cross-sectional view of the wafer of FIG. 14C along the [110] direction.
Figure 15B:
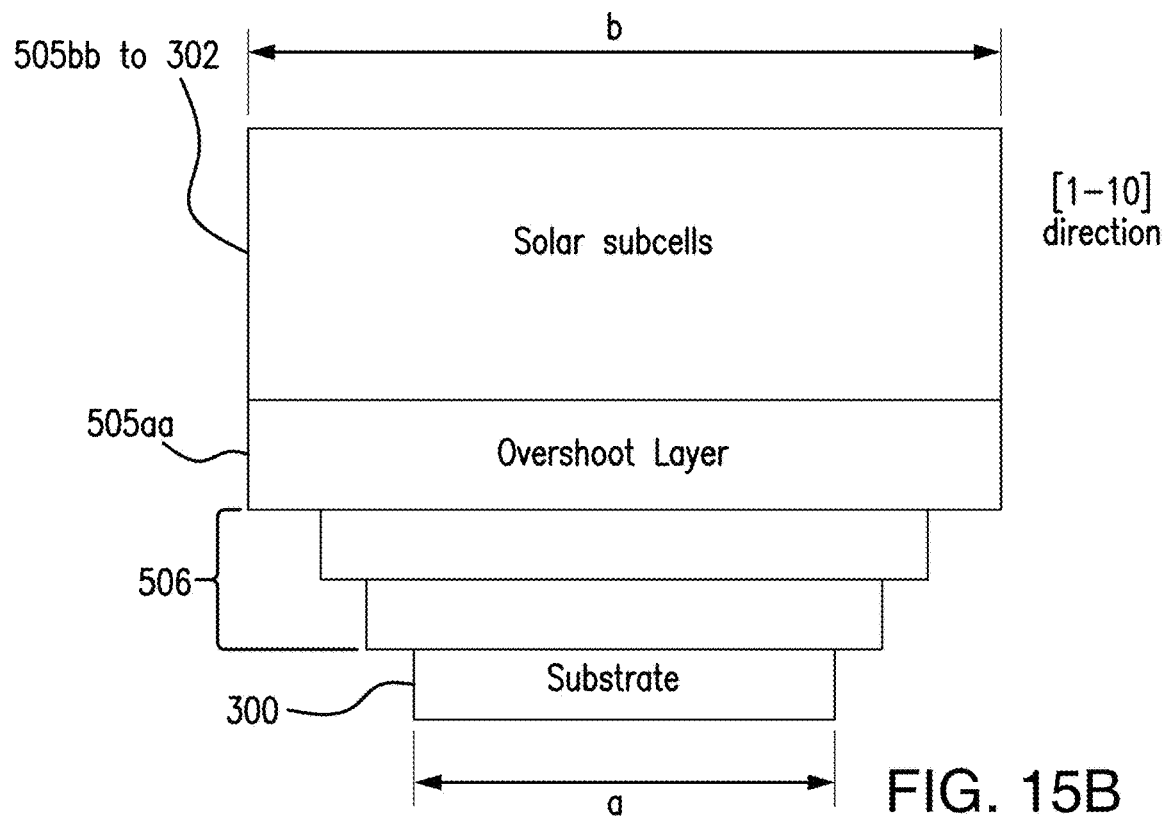
FIG. 15B is a cross-sectional view of the wafer of FIG. 14C along the [1-10] direction.

FIG. 13 is a cross-sectional view of an embodiment of an upright metamorphic four-junction solar cell according to the present disclosure;

FIG. 14A is a perspective view of a wafer prior to the growth of metamorphic layers;

FIG. 14B is a perspective view of the wafer of FIG. 14A after the growth of the metamorphic layers;

FIG. 14C is a perspective view of the wafer of FIG. 14B after the growth of the first and second bowing inhibition layers according to the present disclosure;

FIG. 15A is a cross-sectional view of the wafer of FIG. 14C along the [110] direction; and FIG. 15B is a cross-sectional view of the wafer of FIG. 14C along the [1-10] direction.

It will be understood that each of the elements described above, or two or more together, also may find a useful application in other types of structures or constructions differing from the types of structures or constructions described above.

Although described embodiments of the present disclosure utilizes a vertical stack of four subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell C, with p-type and n-type InGaAs is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional upright multijunction solar cell, it is not intended to be limited to the details shown, since it is also applicable to inverted metamorphic multijunction (IMM) solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell comprising:
a substantially circular semiconductor wafer having a circumferential edge, the semiconductor wafer forming a growth substrate;
a first solar subcell disposed over or in the growth substrate;
a graded interlayer including a plurality of sublayers disposed over the growth substrate;
a sequence of layers of semiconductor material forming a solar cell disposed over the graded interlayer comprising a plurality of subcells including a second subcell disposed over the growth substrate, and at least a third subcell disposed over the second subcell;
a first wafer bowing inhibition layer disposed directly over an uppermost sublayer of the graded interlayer, such bowing inhibition layer having an in-plane lattice constant greater than an in-plane lattice constant of the uppermost sublayer of the graded interlayer, the first wafer bowing inhibition layer having a thickness at least twice that of each and every sublayer of the graded interlayer; and
a second wafer bowing inhibition layer disposed directly over the first wafer bowing inhibition layer, wherein the in-plane lattice constant of the first wafer bowing inhibition layer is equal to a lattice constant of the second wafer bowing inhibition layer and of the second subcell.

2. A multijunction solar cell as defined in claim 1, wherein the graded interlayer has a band gap equal to or greater than that of the second subcell and is compositionally graded to lattice match the growth substrate on one side and the second subcell on the other side; the graded interlayer being composed of any of the As, P, N, Sb base III-V compound semiconductors subject to the constraints of having the in-plane lattice parameter throughout its thickness being greater than or equal to that of the growth substrate, and the graded interlayer including a plurality of N step-graded sublayers where N is an integer and the value of N is 2<N<10, wherein each successive sublayer has an incrementally greater lattice constant than the sublayer below it and is fully relaxed.

3. A solar cell as defined in claim 2, wherein the graded interlayer is composed of $In_xGa_{1-x}As$ with 0<x<1, and x selected such that the grading interlayer has a graded band gap in the range of 1.15 to 1.41 eV, or 1.2 to 1.35 eV, or 1.25 to 1.30 eV.

4. A solar cell as define in claim 1, wherein the thickness of the first wafer bowing inhibition layer is from 250 to 1000 nm.

5. A solar cell as defined in claim 1, wherein the first wafer bowing inhibition layer is strained in a first crystalline direction.

6. A solar cell as defined in claim 1, wherein the second wafer bowing inhibition layer is composed of $Al_xIn_yGa_{1-y}As$ where [0] 0.75<x<1, 0<y<1.

7. A solar cell as defined in claim 1, wherein the second bowing inhibition layer is between 50 nm and 2000 nm in thickness, and has an Al content of 50 to 99% per mole.

8. A solar cell as defined in claim 1, wherein the bowing of the wafer from the center of the wafer to the circumferential edge is less than 120 microns in the worse-case direction, and less than 50 microns in the best-case direction.

9. A solar cell as defined in claim 1, wherein the first wafer bowing inhibition layer has a thickness of 750 nm.

10. A solar cell as defined in claim 1, wherein the graded interlayer is composed of InGaAs and has a thickness in the range of 100 to 500 nm.

11. A solar cell as defined in claim 1, wherein the growth substrate is germanium and has a thickness between 140 and 500 microns.

12. A solar cell as defined in claim 1, wherein the growth substrate has a thickness of between 30 and 120 microns.

13. A solar cell as defined in claim 1, wherein the second solar subcell has a lattice constant that differs from the lattice constant of the growth substrate by 0.02% or less.

14. A solar cell as defined in claim 1, wherein the graded interlayer includes a plurality of step-graded sublayers, wherein each sublayer is not in tension or compression.

15. A solar cell as defined in claim 1, wherein the first wafer bowing inhibition layer has an in-plane lattice constant corresponding to a plane of the first wafer bowing inhibition layer, and an out-of-plane lattice constant in a plane different from the plane of the first wafer bowing inhibition layer wherein the out-of-plane lattice constant is different from the in-plane lattice constant.

16. A multijunction solar cell comprising:
a substantially circular semiconductor wafer having a circumferential edge, the semiconductor wafer forming a growth substrate;
a first solar subcell disposed over or in the growth substrate;
a graded interlayer including a plurality of sublayers disposed over the growth substrate;
a sequence of layers of semiconductor material forming a solar cell disposed over the graded interlayer, the sequence of layers comprising a plurality of subcells including a second subcell disposed over the growth substrate, and at least a third subcell disposed over the second subcell,
wherein the graded interlayer has a band gap equal to or greater than that of the second subcell and is compositionally graded to lattice match the growth substrate on one side and the second subcell on the other side, the graded interlayer including a plurality of N step-graded sublayers where N is an integer and the value of N is 2<N<10, wherein each successive sublayer has an incrementally greater lattice constant than the sublayer below it and is fully relaxed,
the multijunction solar cell further comprising:
a first wafer bowing inhibition layer disposed directly over an uppermost sublayer of the graded interlayer, such bowing inhibition layer having an in-plane lattice constant greater than an in-plane lattice constant of the uppermost sublayer of the graded interlayer, the first wafer bowing inhibition layer having a thickness at least twice that of each and every sublayer of the graded interlayer; and
a second wafer bowing inhibition layer disposed directly over the first wafer bowing inhibition layer.

17. A solar cell as defined in claim 16, wherein the lattice constant of the first wafer bowing inhibition layer in a first crystalline direction is greater than the lattice constant in a second crystalline direction that is orthogonal to the first crystalline direction.

18. A solar cell as defined in claim 17, wherein the first crystalline direction is the [110] direction, and the second crystalline direction is the [1-10] direction.

19. A solar cell as defined in claim 18, wherein the second wafer bowing inhibition layer has the same lattice constant as the first bowing inhibition layer in the [1-10] direction, and a smaller lattice constant in the [110] direction.

20. A solar cell as defined in claim 16, wherein the lattice constant of the first wafer bowing inhibition layer is equal to the lattice constant of the second wafer bowing inhibition layer and of the second subcell.

21. A solar cell as defined in claim 16, wherein the first wafer bowing inhibition layer is composed of InGaAs or (Al)InGaAs, with the indium content at least 0.07 per mole.

22. A solar cell as defined in claim 16, wherein the graded interlayer is composed of InGaAs with the indium content in the range of 0.08 to 0.145 per mole.

* * * * *